US012782811B2

(12) United States Patent
Deng

(10) Patent No.: US 12,782,811 B2
(45) **Date of Patent: *Nov. 3, 2026**

(54) DUAL CATALYST SYSTEM FOR MASS ROMP AND CATIONIC POLYMERIZABLE COMPOSITIONS

(71) Applicant: PROMERUS, LLC, Akron, OH (US)

(72) Inventor: Guodong Deng, Akron, OH (US)

(73) Assignee: PROMERUS, LLC, Akron, OH (US)

( * ) Notice: Subject to any disclaimer, the term of this patent is extended or adjusted under 35 U.S.C. 154(b) by 753 days.

This patent is subject to a terminal disclaimer.

(21) Appl. No.: 18/110,911

(22) Filed: Feb. 17, 2023

(65) Prior Publication Data

US 2023/0266668 A1 Aug. 24, 2023

Related U.S. Application Data

(60) Provisional application No. 63/311,632, filed on Feb. 18, 2022.

(51) Int. Cl.

*G03F 7/031* (2006.01)
*C08G 61/06* (2006.01)
*G03F 7/029* (2006.01)

(52) U.S. Cl.

CPC ............ *G03F 7/031* (2013.01); *C08G 61/06* (2013.01); *G03F 7/0295* (2013.01)

(58) Field of Classification Search

None

See application file for complete search history.

(56) References Cited

U.S. PATENT DOCUMENTS 7,728,090 B2* 6/2010 Liaw ..................... C08F 232/08 549/560
11,286,338 B2* 3/2022 Rhodes .................. B33Y 10/00
11,291,983 B2* 4/2022 Gawin ................. B01J 31/2273
11,554,365 B2* 1/2023 Gawin ................. C07D 207/02
11,732,086 B2* 8/2023 Rhodes ................ B01J 31/2278 522/53
11,834,542 B2* 12/2023 Rhodes ................... C08F 32/08
2012/0056183 A1* 3/2012 Mueller ................ C08F 232/00 438/161
2012/0149815 A1* 6/2012 Onishi .................. C08F 232/08 526/273
2015/0118188 A1* 4/2015 Weitekamp ............. A61L 27/16 522/63
2016/0147145 A1* 5/2016 Ng ........................ G03F 7/0382 430/286.1
2016/0187775 A1 6/2016 Ng et al.
2016/0238931 A1* 8/2016 Ng ........................ G03F 7/0045
2017/0306171 A1 10/2017 Vidavsky et al.
2018/0030189 A1* 2/2018 Knapp .................... G03F 7/322
2021/0077988 A1* 3/2021 Gawin ................ C07F 15/0046
2021/0079133 A1* 3/2021 Rhodes .................. C08G 61/08
2021/0079156 A1 3/2021 Rhodes et al.
2021/0206789 A1* 7/2021 Burtovyy .............. C08F 4/7088
2022/0002453 A1* 1/2022 Hayakawa ............ C08F 110/14
2022/0243002 A1* 8/2022 Burtovyy ............... C08G 61/08
2023/0038665 A1* 2/2023 Hayakawa ............... C09D 4/00
2025/0122402 A1* 4/2025 Byrne ...................... C09D 4/00

FOREIGN PATENT DOCUMENTS

JP 2001/059018 A 3/2001
WO WO-2021138651 A1 * 7/2021 ................ C08J 5/18
WO WO-2021262921 A1 * 12/2021 ............ C08F 4/7027

OTHER PUBLICATIONS

Written Opinion of the ISA: PCT/US2023/013263, Jun. 8, 2023.

* cited by examiner

*Primary Examiner* — Martin J Angebranndt
(74) *Attorney, Agent, or Firm* — Balaram Gupta

(57) ABSTRACT

Embodiments in accordance with the present invention encompass compositions comprising an organoruthenium compound, a photoacid generator, a photosensitizer, one or more epoxy group containing olefinic monomers. The compositions of this invention may additionally contain one or more olefinic monomers. The compositions undergo simultaneous ring open metathesis polymerization (ROMP) and cationic polymerization when exposed to a suitable actinic radiation to form a substantially transparent film. The compositions of this invention are stable at room temperature for several days to several months and undergo mass polymerization only when subjected to suitable actinic radiation. The monomers employed therein have a range of optical and mechanical properties, and thus these compositions can be tailored to form films having various opto-electronic properties. More specifically, the compositions of this invention undergo much faster mass polymerization and exhibit superior thermo-mechanical properties when compared with the compositions containing only the olefinic monomers. Accordingly, compositions of this invention are useful in various applications, including as coatings, encapsulants, fillers, leveling agents, sealants, adhesives, among others.

17 Claims, No Drawings

DUAL CATALYST SYSTEM FOR MASS ROMP AND CATIONIC POLYMERIZABLE COMPOSITIONS

CROSS REFERENCE TO RELATED APPLICATIONS

This application claims the benefit of U.S. Provisional Application No. 63/311,632, filed Feb. 18, 2022, which is incorporated herein by reference in its entirety.

BACKGROUND OF THE INVENTION

Field of the Invention

Embodiments in accordance with the present invention relate generally to a long shelf life stable single component mass ring open metathesis polymerizable (ROMP) and cationic polymerizable oxirane substituted polycycloolefin monomer compositions having high optical transparency, thus finding utility in a variety of applications such as for example in optical devices, such as optical sensors, light emitting diodes (LEDs), organic light emitting diode (OLED), among other devices. More specifically, this invention relates to single component compositions encompassing norbornene (NB) based olefinic monomers substituted with epoxy groups, which are very stable at room temperature and undergo mass ROMP and cationic polymerization only when exposed to suitable actinic radiation in the presence of organoruthenium catalysts to form optical layers having utility in a variety of opto-electronic applications including as encapsulants, coatings, ink-jetting, adhesives, sealants, 3D printing and as fillers in a variety of applications.

Description of the Art

Light activated (specifically ultraviolet) mass polymerizable compositions are gaining much importance in a variety of opto-electronic applications, which include for example, coating, ink-jetting, adhesive, sealant, 3D printing and photoresist, and the like. Generally, such compositions have become popular due to their high productivity, ease of application and lower impact on the environment. Two compositions that are particularly popular in the industry are the acrylate based compositions (free radical polymerization) and epoxies (cationic polymerization). However, both of these compositions have limited applications as they generally exhibit low glass transition temperatures ($T_g$) and high water absorption among other undesirable properties.

In order to address some of the issues faced by the art, U.S. Pat. No. 8,263,235 discloses use of a light emitting layer formed from at least one organic light emitting material and an aliphatic compound not having an aromatic ring, and a refractive index of the light emitting from 1.4 to 1.6. The aliphatic compounds described therein are generally a variety of polyalkyl ethers, and the like, which are known to be unstable at high temperatures, see for example, Rodriguez et al., I & EC Product Research and Development, Vol. 1, No. 3, 206-210 (1962).

U.S. Pat. Nos. 9,944,818 and 10,266,720, disclose a two component mass polymerizable composition which is capable of tailoring to the desirable refractive index and is suitable as a filler and a protective coating material, thus potentially useful in the fabrication of a variety of organic light emitting diodes (OLED) devices.

U.S. Pat. No. 10,626,198, discloses a single component mass vinyl addition polymerizable composition which is thermally activated and capable of tailoring to the desirable refractive index and is suitable as a filler and a protective coating material, thus potentially useful in the fabrication of a variety of OLED devices.

However, there is still a need for organic filler materials that are stable at ambient conditions to fabricating temperature conditions of various devices and undergo rapid mass polymerization only when exposed to suitable actinic radiation at ambient temperature or at suitable elevated temperatures.

Thus, it is an object of this invention to provide organic materials that overcome the gaps faced by the art. More specifically, it is an object of this invention to provide a single component composition that will mass polymerize when exposed to suitable actinic radiation under the conditions of the fabrications of a device such as for example an OLED device yet remains stable when stored at ambient temperature conditions. It is further an object of this invention to provide stable single component mass polymerizable composition with no change in viscosity at or below normal storage conditions but which undergoes mass polymerization only when exposed to suitable actinic radiation.

It is further an object of this invention to provide single component composition that can be used in a variety of other applications including for example 3D printing, ink-jettable coatings, sealants, and the like.

Other objects and further scope of the applicability of the present invention will become apparent from the detailed description that follows.

SUMMARY OF THE INVENTION

Surprisingly, it has now been found that by employing a single component composition encompassing one or more olefinic monomers in combination with an epoxy group it is now possible to mass polymerize such compositions by ring open metathesis polymerization (ROMP) as well as ring opening of the epoxy groups to form polyethers simultaneously. The compositions of this invention are stable at ambient conditions for several days, and can be employed for the fabrication of a variety of devices including for example an OLED device having a transparent optical layer which features hitherto unachievable properties, i.e., high colorless optical transparency, desirable film thickness of the filler layer typically in the range of 10 to 20 μm but can be tailored to lower or higher film thickness depending upon the intended application, compatible with the OLED stack, particularly the cathode layer (a very thin layer on the top of the OLED stack), compatible with polymerization of the formulation on the OLED stack, including fast polymerization time and can be photolytically treated at ambient fabrication conditions, adhesion to both OLED stack and glass cover, and the like. It is also important to note that the compositions of this invention are expected to exhibit good uniform leveling across the OLED layer which typically requires a low viscosity. Further, compositions of this invention cure at a much faster rate with very high conversion than other compositions known in the art as they exhibit faster polymerization rates when exposed to suitable actinic radiation. Also expected to exhibit low shrinkage due to their rigid polycycloolefinic structure. In addition, as the components of this invention undergo fast mass polymerization upon application they do not leave behind any fugitive small molecules which can damage the OLED stack. Generally, no other small molecule additives need to be employed thus offering additional advantages. Most importantly, the compositions of this invention are stable (i. e., no change in viscosity) at ambient atmospheric conditions for several days to weeks and undergo mass polymerization only when exposed to suitable actinic radiation. The compositions undergo mass ROMP/epoxy ring opening very quickly when subjected to such actinic radiation and generally the compositions become solid objects in few seconds to minutes, i.e., within 30 seconds to three minutes and more generally in less than five minutes. The solid articles made from the compositions of this invention exhibit improved properties, such as for example, improved solvent resistance, improved mechanical properties, and the like.

Accordingly, there is provided a single component composition encompassing a) one or more olefinic monomers containing oxirane (i.e., epoxy) or oxetane groups optionally in combination with one or more olefinic monomers; b) an organoruthenium compound of formula (I) or (II), as described herein; c) a photoacid generator as described herein; and d) a photosensitizer.

In another aspect of this invention there is also provided a kit encompassing the composition of this invention for forming a three dimensional object, such as for example, a transparent film.

DETAILED DESCRIPTION

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "〰" denotes a position at which the bonding takes place with another repeat unit or another atom, molecule, group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the term "alkyl" concerns a saturated, straight-chain or branched-chain hydrocarbon substituent having the specified number of carbon atoms. The non-limiting examples of alkyls are: methyl, ethyl, propyl, isopropyl, butyl, sec-butyl, tert-butyl, pentyl, and the like. Derived expressions such as "($C_1$-$C_4$)alkoxy", "($C_1$-$C_4$)thioalkyl" "($C_1$-$C_4$)alkoxy($C_1$-$C_4$)alkyl", "hydroxy($C_1$-$C_4$)alkyl", "($C_1$-$C_4$)alkylcarbonyl", "($C_1$-$C_4$)alkoxycarbonyl($C_1$-$C_4$)alkyl", "($C_1$-$C_4$)alkoxycarbonyl", "diphenyl($C_1$-$C_4$)alkyl", "phenyl($C_1$-$C_4$)alkyl", "phenylcarboxy($C_1$-$C_4$)alkyl" and "phenoxy($C_1$-$C_4$)alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "perfluoroalkyl" means that all of the hydrogen atoms in said alkyl group having a specified number of carbon atoms are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "($C_1$-$C_6$)perfluoroalkoxy", is to be construed accordingly. It should further be noted that certain of the alkyl groups as described herein, such as for example, "($C_1$-$C_6$)alkyl" may partially be fluorinated, that is, only portions of the hydrogen atoms in said alkyl group are replaced with fluorine atoms and shall be construed accordingly.

The term "aryl" concerns an aromatic mono- or polycyclic hydrocarbon substituent having the specified number of carbon atoms. The non-limiting examples of aryl are: phenyl, mesityl, anthracenyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art.

As used herein, the expression "arylalkyl" means that the aryl as defined herein is further attached to alkyl as defined herein having the specified number of carbon atoms. Representative examples include benzyl, phenylethyl, 2-phenylpropyl, 1-naphthylmethyl, 2-naphthylmethyl and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of ($C_1$-$C_6$)alkyl, ($C_2$-$C_6$)alkenyl, ($C_1$-$C_6$)perfluoroalkyl, phenyl, hydroxy, —$CO_2H$, an ester, an amide, ($C_1$-$C_6$)alkoxy, ($C_1$-$C_6$)thioalkyl and ($C_1$-$C_6$)perfluoroalkoxy. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

By the term "derived" is meant that the polymeric repeating units are polymerized (formed) from, for example, polycyclic monomers, such as norbornene-type monomers in accordance with formulae (V) or (VI) or (VII) wherein the resulting polymers are ring opened metathesis polymerized (ROMP), for example, the 2,3 double bond of norbornene-type monomers are ring opened and polymerized as shown below:

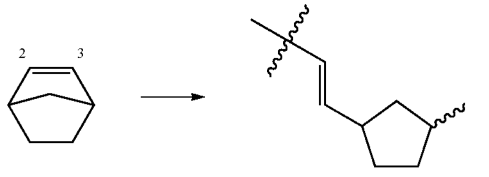

Similarly, the epoxy substituted monomers of formula (V) as defined herein further undergo cationic ring opening polymerization of the epoxy groups to form polyethers as shown below:

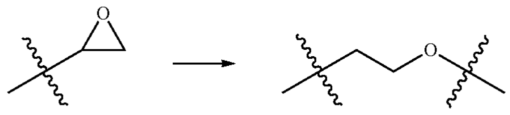

It should further be noted that monomers of formula (V) as defined herein can also contain various other cationic ring opening polymerizable groups, such as for example, oxetane which will undergo cationic polymerization as described above.

Accordingly, in accordance with the practice of this invention there is provided a single component composition encompassing:

a) one or more of an epoxy group containing monomer of formula (V):

(V)

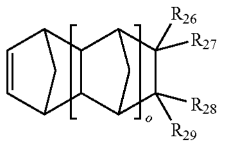

wherein:

is an integer from 0 to 2, inclusive;

at least one of $R_{26}$, $R_{27}$ $R_{28}$ and $R_{29}$ is selected from the group consisting of epoxy($C_1$-$C_{12}$)alkyl, epoxy($C_1$-$C_{12}$)alkyl($C_3$-$C_8$)cycloalkyl, epoxy($C_1$-$C_{12}$)alkyl($C_6$-$C_{12}$)aryl, epoxy($C_1$-$C_{12}$)alkyloxy($C_1$-$C_{12}$)alkyl and epoxy($C_3$-$C_8$)cycloalkyl;

the remaining $R_{26}$, $R_{27}$ $R_{28}$ and $R_{29}$ are the same or different and independently of each other selected from the group consisting of hydrogen, halogen and hydrocarbyl, where hydrocarbyl is selected from methyl, ethyl, linear or branched ($C_3$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_3$)alkyl, ($C_1$-$C_{12}$) alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy($C_1$-$C_3$)alkyl or ($C_6$-$C_{10}$)aryloxy;

b) one or more olefinic monomer of the formula (VI):

(VI)

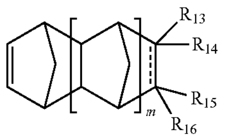

wherein:

m is an integer 0, 1 or 2;

----- is a single bond or a double bond;

$R_{13}$, $R_{14}$, $R_{15}$ and $R_{16}$ are the same or different and each independently selected from the group consisting of hydrogen, halogen, a hydrocarbyl or halohydrocarbyl group selected from methyl, ethyl, linear or branched ($C_3$-$C_{16}$)alkyl, perfluoro($C_1$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_6$)alkyl, perfluoro($C_6$-$C_{10}$)aryl, perfluoro($C_6$-$C_{10}$)aryl($C_1$-$C_6$)alkyl, methoxy, ethoxy, linear or branched ($C_3$-$C_{16}$)alkoxy, perfluoro ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy, ($C_6$-$C_{10}$)aryl($C_1$-$C_6$)alkoxy, perfluoro($C_6$-$C_{10}$)aryloxy, perfluoro($C_6$-$C_{10}$)aryl($C_1$-$C_3$)alkoxy, a group of formula (A):

—Z-Aryl (A);

a group of formula (A1):

(A1)

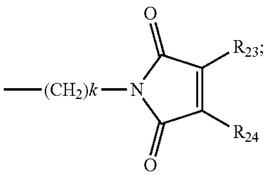

a group of formula (A2):

(A2)

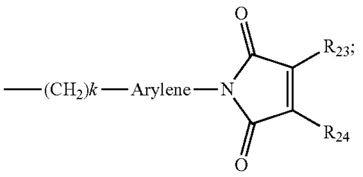

a group of formula (A3):

(A3)

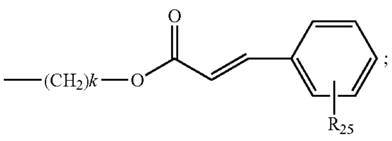

and a group of formula (A4):

(A4)

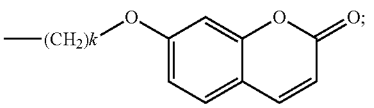

wherein:

Z is selected from the group consisting of:

O, CO, C(O)O, OC(O), OC(O)O, S, $(CR_{17}R_{18})_b$, $O(CR_{17}R_{18})_b$, $(CR_{17}R_{18})_bO$, $C(O)(CR_{17}R_{18})_b$, $(CR_{17}R_{18})_bC(O)$, $C(O)O(CR_{17}R_{18})_b$, $(CR_{17}R_{18})_bC(O)O$, $OC(O)(CR_{17}R_{18})_b$, $(CR_{17}R_{18})_bOC(O)$, $(CR_{17}R_{18})_bOC(O)O$, $(CR_{17}R_{18})_bOC(O)O(CR_{17}R_{18})_b$, $OC(O)O(CR_{17}R_{18})_b$, $S(CR_{17}R_{18})_b$, $(CR_{17}R_{18})_bS$, $(SiR_{17}R_{18})_b$, $O(SiR_{17}R_{18})_b$, $(SiR_{17}R_{18})_bO$, where $R_{17}$ and $R_{18}$ are the same or different and each independently selected from hydrogen, methyl, ethyl, linear or branched $(C_3\text{-}C_{12})$alkyl, substituted or unsubstituted $(C_6\text{-}C_{14})$aryl, methoxy, ethoxy, linear or branched $(C_3\text{-}C_6)$alkyloxy, $(C_2\text{-}C_6)$acyl, $(C_2\text{-}C_6)$acyloxy, and substituted or unsubstituted $(C_6\text{-}C_{14})$aryloxy; and b is an integer from 0 to 12, inclusive;

Aryl is selected from the group consisting of substituted or unsubstituted phenyl, substituted or unsubstituted biphenyl, substituted or unsubstituted naphthyl, substituted or unsubstituted terphenyl, substituted or unsubstituted anthracenyl and substituted or unsubstituted fluorenyl, wherein said substituents are selected from the group consisting of halogen, methyl, ethyl, linear or branched $(C_3\text{-}C_6)$alkyl, perfluoro$(C_1\text{-}C_{12})$alkyl, $(C_3\text{-}C_{12})$cycloalkyl, $(C_6\text{-}C_{10})$aryl, $(C_6\text{-}C_{10})$aryl$(C_1\text{-}C_6)$alkyl, perfluoro$(C_6\text{-}C_{10})$aryl, perfluoro$(C_6\text{-}C_{10})$aryl$(C_1\text{-}C_6)$alkyl, methoxy, ethoxy, linear or branched $(C_3\text{-}C_{16})$alkoxy, perfluoro$(C_1\text{-}C_{12})$alkoxy, $(C_3\text{-}C_{12})$cycloalkoxy, $(C_6\text{-}C_{10})$aryloxy, $(C_6\text{-}C_{10})$aryl$(C_1\text{-}C_6)$alkoxy, perfluoro$(C_6\text{-}C_{10})$aryloxy and perfluoro$(C_6\text{-}C_{10})$aryl$(C_1\text{-}C_3)$alkoxy;

k is an integer from 1 to 12;

$R_{23}$, $R_{24}$ and $R_{25}$ are the same or different and each independently selected from the group consisting of hydrogen, methyl, ethyl, linear or branched $(C_3\text{-}C_{12})$alkyl, perfluoro$(C_1\text{-}C_{12})$alkyl, methoxy, ethoxy, linear or branched $(C_3\text{-}C_{12})$alkoxy, $(C_3\text{-}C_{12})$cycloalkyl, $(C_6\text{-}C_{12})$bicycloalkyl, $(C_7\text{-}C_{14})$tricycloalkyl, $(C_6\text{-}C_{10})$aryl, $(C_6\text{-}C_{10})$aryl$(C_1\text{-}C_6)$alkyl, perfluoro$(C_6\text{-}C_{10})$aryl and perfluoro$(C_6\text{-}C_{10})$aryl$(C_1\text{-}C_6)$alkyl; or $R_{23}$ and $R_{24}$ taken together with the intervening carbon atoms to which they are attached to form a substituted or unsubstituted $(C_5\text{-}C_{14})$cyclic, $(C_5\text{-}C_{14})$bicyclic or $(C_5\text{-}C_{14})$tricyclic ring; and Arylene is substituted or unsubstituted bivalent $(C_6\text{-}C_{14})$aryl;

or one of $R_1$ and $R_2$ taken together with one of $R_3$ and $R_4$ and the carbon atoms to which they are attached to form a substituted or unsubstituted $(C_5\text{-}C_{14})$cyclic, $(C_5\text{-}C_{14})$bicyclic or $(C_5\text{-}C_{14})$tricyclic ring;

c) an organoruthenium compound selected from the group consisting of:

a compound of formula (I):

(I)

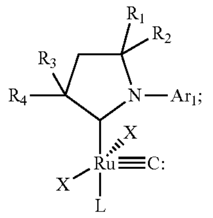

and a compound of formula (II):

(II)

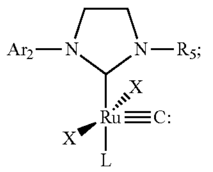

wherein:

X is a halogen, i.e., fluorine, chlorine, bromine, iodine, or an anionic ligand;

L is a ligand selected from the group consisting of $P(R)_3$, $P(OR)_3$, $O{=}P(R)_3$, RCN and substituted or unsubstituted pyridines, where R is selected from the group consisting of methyl, ethyl, linear or branched $(C_3\text{-}C_{16})$alkyl, $(C_1\text{-}C_{16})$perfluoroalkyl, $(C_3\text{-}C_{10})$cycloalkyl, $(C_6\text{-}C_{10})$aryl$(C_1\text{-}C_{16})$alkyl, substituted or unsubstituted $(C_6\text{-}C_{10})$aryl, methoxy, ethoxy, linear or branched $(C_3\text{-}C_{16})$alkoxy, $(C_1\text{-}C_{16})$perfluoroalkoxy, $(C_3\text{-}C_{10})$cycloalkoxy, $(C_6\text{-}C_{10})$aryl$(C_1\text{-}C_{16})$alkoxy and substituted or unsubstituted $(C_6\text{-}C_{10})$aryloxy;

$R_1$ and $R_2$ are the same or different and each independently selected from the group consisting of hydrogen, methyl, ethyl, linear or branched $(C_3\text{-}C_{16})$alkyl, $(C_6\text{-}C_{10})$aryl, methoxy, ethoxy, linear or branched $(C_1\text{-}C_6)$alkoxy, $(C_6\text{-}C_{10})$aryloxy, $-NHCO(C_1\text{-}C_6)$alkyl, $-NHCO$-perfluoro$(C_1\text{-}C_6)$alkyl, $-SO_2N((C_1\text{-}C_6)alkyl)_2$ and $-NO_2$; or $R_1$ and $R_2$ taken together with the carbon atom to which they are attached to form a $(C_3\text{-}C_7)$cycloalkyl ring;

$R_3$ and $R_4$ are the same or different and each independently selected from the group consisting of hydrogen, methyl, ethyl and linear or branched $(C_1\text{-}C_6)$alkyl;

$R_5$ is selected from the group consisting of methyl, ethyl, isopropyl, sec-butyl, tert-butyl, substituted or unsubstituted cyclohexyl, substituted or unsubstituted phenyl, substituted or unsubstituted biphenyl and substituted or unsubstituted naphthyl;

$Ar_1$ and $Ar_2$ are the same or different and each independently selected from the group consisting of substituted or unsubstituted phenyl, substituted or unsubstituted biphenyl and substituted or unsubstituted naphthyl;

wherein said substituents are selected from the group consisting of methyl, ethyl, iso-propyl, tert-butyl and phenyl;

d) a photoacid generator selected from the group consisting of:

a compound of formula (III):

(III)

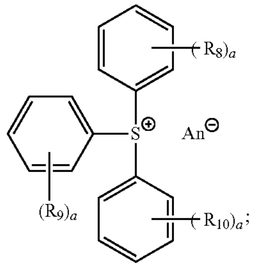

a compound of formula (IV):

(IV)

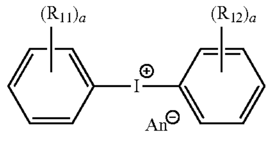

wherein:

a is an integer from 0 to 5;

$An^{\ominus}$ is selected from the group consisting of $Cl^{\ominus}$, $Br^{\ominus}$, $I^{\ominus}$, $BF_4^{\ominus}$, tetrakis(pentafluorophenyl)borate, tetrakis(3,5-bis(trifluoromethyl)phenyl)borate, tetrakis(2-fluorophenyl)borate, tetrakis(3-fluorophenyl)borate, tetrakis(4-fluorophenyl)borate, tetrakis(3,5-difluorophenyl)borate, tetrakis(2,3,4,5-tetrafluorophenyl)borate, tetrakis(3,4,5,6-tetrafluorophenyl)borate, tetrakis(3,4,5-trifluorophenyl)borate, methyltris(perfluorophenyl)borate, ethyltris(perfluorophenyl)borate, phenyltris(perfluorophenyl)borate, tetrakis(1,2,2-trifluoroethylenyl)borate, tetrakis(4-tri-1-propylsilyltetrafluorophenyl)borate, tetrakis(4-dimethyl-tert-butylsilyltetrafluorophenyl)borate, (triphenylsiloxy)tris(pentafluorophenyl)borate, (octyloxy)tris(pentafluorophenyl)borate, tetrakis[3,5-bis[1-methoxy-2,2,2-trifluoro-1-(trifluoromethyl)ethyl]phenyl]borate, tetrakis[3-[1-methoxy-2,2,2-trifluoro-1-(trifluoromethyl)ethyl]-5-(trifluoromethyl)phenyl]borate, and tetrakis[3-[2,2,2-trifluoro-1-(2,2,2-trifluoroethoxy)-1-(trifluoromethyl)-ethyl]-5-(trifluoromethyl)phenyl]borate, $PF_6^{\ominus}$, $SbF_6^{\ominus}$, n-$C_4F_9SO_3^{\ominus}$, $CF_3SO_3^{\ominus}$ and p-$CH_3(C_6H_4)$—$SO_3^{\ominus}$;

$R_8$, $R_9$, $R_{10}$, $R_{11}$ and $R_{12}$ are the same or different and each independently selected from the group consisting of halogen, methyl, ethyl, linear or branched ($C_3$-$C_{20}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$) aryl($C_1$-$C_3$)alkyl, ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy($C_1$-$C_3$)alkyl, ($C_6$-$C_9$)-aryloxy, ($C_6$-$C_{10}$)thioaryl, ($C_1$-$C_6$)alkanoyl($C_6$-$C_{10}$)thioaryl, ($C_1$-$C_6$)alkoxy ($C_6$-$C_{10}$) aroyl($C_1$-$C_6$)alkyl and ($C_6$-$C_{10}$)thioaryl-($C_6$-$C_{10}$)diarylsulfonium salt; and e) a photosensitizer.

In some embodiments L is $P(R)_3$, where R is independently selected from the group consisting of isopropyl, sec-butyl, tert-butyl, cyclohexyl, bicyclo($C_5$-$C_{10}$)alkyl, phenyl, benzyl, isopropoxy, sec-butoxy, tert-butoxy, cyclohexyloxy, phenoxy and benzyloxy.

It should further be noted that the ligand, L of the organoruthenium compound of formula (I) or (II) can generally be a Lewis base, which is coordinately bonded to ruthenium. That is, the Lewis base is bonded to ruthenium by sharing both of its lone pair of electrons. Accordingly, any of the Lewis base known in the art that would function as such can be used for this purpose.

Accordingly, it has now been found that suitable LBs that can be employed include without any limitation substituted and unsubstituted nitriles, including alkyl nitrile, aryl nitrile or aralkyl nitrile; phosphine oxides, including substituted and unsubstituted trialkyl phosphine oxides, triaryl phosphine oxides, triarylalkyl phosphine oxides, and various combinations of alkyl, aryl and aralkyl phosphine oxides; substituted and unsubstituted pyrazines; substituted and unsubstituted pyridines; phosphites, including substituted and unsubstituted trialkyl phosphites, triaryl phosphites, triarylalkyl phosphites, and various combinations of alkyl, aryl and aralkyl phosphites; phosphines, including substituted and unsubstituted trialkyl phosphines, triaryl phosphines, triarylalkyl phosphines, and various combinations of alkyl, aryl and aralkyl phosphines. Various other LBs that may be employed include various ethers, alcohols, ketones, amines and anilines, arsines, stibines, and the like.

It should further be noted that some of the Lewis base used herein may also act as stabilizers of the compositions as described further herein. Accordingly, in some embodiments the Lewis base employed function both as a ligand for the catalyst as well as a stabilizer for the composition of this invention. Accordingly, judicious selection of the Lewis base (i.e., L) in suitable amounts as described herein may provide uniquely advantageous benefits in not only stabilizing the composition of this invention but also activate the catalyst only when subjected to suitable actinic radiation as further described hereinbelow.

In some embodiments of this invention, the LB is selected from acetonitrile, propionitrile, n-butyronitrile, tert-butyronitrile, benzonitrile ($C_6H_5CN$), 2,4,6-trimethylbenzonitrile, phenyl acetonitrile ($C_6H_5CH_2CN$), pyridine, 2-methylpyridine, 3-methylpyridine, 4-methylpyridine, 2,3-dimethylpyridine, 2,4-dimethylpyridine, 2,5-dimethylpyridine, 2,6-dimethylpyridine, 3,4-dimethylpyridine, 3,5-dimethylpyridine, 2,6-di-t-butylpyridine, 2,4-di-t-butylpyridine, 2-methoxypyridine, 3-methoxypyridine, 4-methoxypyridine, pyrazine, 2,3,5,6-tetramethylpyrazine, diethyl ether, di-n-butyl ether, dibenzyl ether, tetrahydrofuran, tetrahydropyran, benzophenone, triphenylphosphine oxide, triphenyl phosphate or phosphines or phosphites of formula $PR_3$, where R is independently selected from methyl, ethyl, ($C_3$-$C_6$)alkyl, substituted or unsubstituted ($C_3$-$C_7$)cycloalkyl, ($C_6$-$C_{10}$) aryl, ($C_6$-$C_{10}$) aralkyl, methoxy, ethoxy, ($C_3$-$C_6$)alkoxy, substituted or unsubstituted ($C_3$-$C_7$)cycloalkoxy, ($C_6$-$C_{10}$)aryloxy or ($C_6$-$C_{10}$)arylalkoxy. Representative examples of $PR_3$ include without any limitation trimethyl phosphine, triethyl phosphine, tri-n-propyl phosphine, tri-iso-propyl phosphine, tri-n-butyl phosphine, tri-iso-butyl phosphine, tri-tert-butyl phosphine, tricyclopentylphosphine, triallylphosphine, tricyclohexylphosphine, triphenyl phosphine, trimethyl phosphite, triethyl phosphite, trifluoroethyl phosphite, tri-n-propyl phosphite, tri-iso-propyl phosphite, tri-n-butyl phosphite, tri-iso-butyl phosphite, tri-tert-butyl phosphite, tricyclopentylphosphite, triallylphosphite, tricyclohexylphosphite, triphenyl phosphite, and the like. It should however be noted that various other known LBs which will bring about the intended activity can also be used in this embodiment of the invention.

Various olefinic monomers containing at least one epoxy group can be employed in the composition of this invention which undergoes simultaneously ROMP and cationic ring opening of the epoxy groups to form polyether-polyalkane networks. Suitable examples of such epoxy group containing olefinic monomers include monomers of the formula (V) as described herein. It is further contemplated that an epoxy group containing monomer in combination with a suitable olefinic monomer can also be employed. Such olefinic monomers include without any limitation alicyclic olefins, such as ethylene, propylene, butylene, styrene, and the like. Other olefinic monomers include cyclo-olefins and bicyclo-olefins, and so on. More specifically, the monomers of formula (VI) as defined herein are included in the exemplary embodiments of this invention.

Even more specifically, the Aryl as defined herein is substituted or unsubstituted biphenyl of formula:

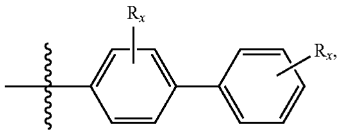

substituted or unsubstituted naphthyl of formula:

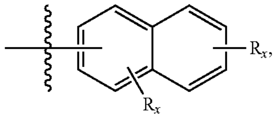

substituted or unsubstituted terphenyl of formula:

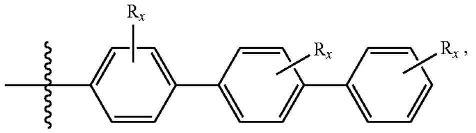

substituted or unsubstituted anthracenyl of formula:

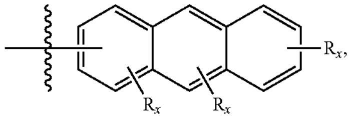

substituted or unsubstituted fluorenyl of formula:

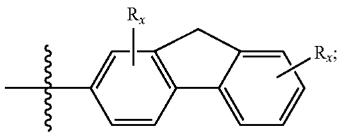

where $R_x$ in each occurrence is independently selected from methyl, ethyl, linear or branched ($C_3$-$C_{12}$)alkyl or ($C_6$-$C_{10}$)aryl.

Other suitable monomers include oxetane group containing olefinic monomers similar in scope to those of monomers of formula (V). The oxetane groups similarly undergo cationic polymerization to form the polyethers.

Even more importantly, the composition of this invention contains at least one monomer of formula (VI) as described herein.

The monomers of formulae (V) or (VI) as described herein are themselves known in the literature or can be prepared by any of the known methods in the art to make such or similar types of monomers.

In addition, the monomers as described herein readily undergo mass ROMP as well as cationic polymerization, i.e., in their neat form without use of any solvents by ROMP using transition metal procatalysts, such as for example, organoruthenium compounds as described herein. The cationic polymerization occurs by way of acid generated during exposure to a suitable actinic radiation. The term "mass polymerization" as used herein shall have the generally accepted meaning in the art. That is, a polymerization reaction that is generally carried out substantially in the absence of a solvent. In some cases, however, a small proportion of solvent is present in the reaction medium. For example, such small amounts of solvent may be used to dissolve the organoruthenium compound of formulae (I), a photoacid generator or photosensitizer as described herein or convey the same to the reaction medium. Also, some solvent may be used to reduce the viscosity of the monomer. The amount of solvent that can be used in the reaction medium may be in the range of 0 to 5 weight percent based on the total weight of the monomers employed. Any of the suitable solvents that dissolve the organoruthenium compound of formulae (I), a photoacid generator or photosensitizer and/or monomers can be employed in this invention. Examples of such solvents include alkanes, cycloalkanes, aromatics, such as toluene, ester solvents such as ethyl acetate, THF, dichloromethane, dichloroethane, and the like.

Advantageously, it has now been found that one or more of the monomers themselves can be used to dissolve the organoruthenium compound of formula (I) or (II) or a photoacid generator or photosensitizer and thus avoiding the need for the use of solvents. In addition, one monomer can itself serve as a solvent for the other monomer and thus eliminating the need for an additional solvent. For example, if a monomer of formula (V) is a solid at room temperature, then a monomer of formula (VI), which is a liquid at room temperature can be used as a solvent for the monomer of formula (V) which is a solid or vice versa. Therefore, in such situations more than one monomer can be employed in the composition of this invention.

In some other embodiments, it is generally contemplated that monomer of formulae (V) or (VI) may also be used as a viscosity modifier. Accordingly, in general, such a monomer of formulae (V) or (VI) is a liquid at room temperature and can be used in conjunction with another monomer of formula (VI) which is a solid or a high viscosity liquid.

In a further embodiment of this invention the composition of this invention encompasses at least two different monomers of formula (V) and is in a clear liquid state having a viscosity below 100 centipoise. In general, the composition of this invention exhibits low viscosity, which can be below 100 centipoise. In some embodiments, the viscosity of the composition of this invention is less than 90 centipoise. In some other embodiments the viscosity of the composition of this invention is in the range from about 5 to 100 centipoise. In yet some other embodiments the viscosity of the composition of this invention is lower than 80 cP, lower than 60 cP, lower than 40 cP, lower than 20 cP. In some other embodiments it may even be lower than 10 cP or lower than 8 cP.

When the composition of this invention contains two monomers, they can be present in any desirable amounts that would bring about the intended benefit, including either refractive index modification or viscosity modification or both or any other desirable property depending upon the intended final application. Accordingly, for example, the molar ratio of monomer of formula (V) to monomer of formula (VI) can be from 1:99 to 100:0. That is, monomer of formula (V) can be used in small amounts in combination with a monomer of formula (VI) in certain applications. In other words, any amount of these two monomers can be employed except that certain amounts of monomer of formula (V) is always present. In some embodiments, the molar ratio of monomer of formula (V):monomer of formula (VI)

is in the range from 1:99 to 99:1; in some other embodiments it is from 5:95 to 95:5; it is from 10:90 to 90:10; it is from 20:80 to 80:20; it is from 30:70 to 70:30; it is from 60:40 to 40:60; and it is 50:50, and so on.

In general, the compositions in accordance with the present invention encompass the above described one or more of monomer of formula (V) and one or more of monomer of formula (VI), as it will be seen below, various composition embodiments are selected to provide properties to such embodiments that are appropriate and desirable for the use for which such embodiments are directed, thus such embodiments are tailorable to a variety of specific applications, provided however certain amount of monomer of formula (V) is always present in the composition of this invention as describe above. Accordingly, in some embodiments the composition of this invention contains more than two distinct monomers of formulae (V) and (VI), such as for example two different monomers of formulae (V) and a monomer of formula (VI) or two different monomers of formulae (V) and two different monomers of formula (VI).

For example, as already discussed above, proper combination of different monomers of formulae (V) and (VI) makes it possible to tailor a composition having the desirable refractive index, viscosity and optical transmission properties, among other properties. In addition, it may be desirable to include other polymeric or monomeric materials which are compatible to provide desirable optical properties depending upon the end use application. Accordingly, the compositions of this invention can also include other high refractive polymeric materials which will bring about such intended benefit. Examples of such polymers include without any limitation, poly(α-methylstyrene), poly(vinyl-toluene), copolymers of α-methylstyrene and vinyl-toluene, and the like.

Advantageously, it has further been found that the compositions of this invention can also contain additional monomers different from the monomers of formulae (V) and/or (VI) if present. In some embodiments, the composition according to this invention may further contain one or more monomers of formula (VII).

The monomer of formula (VII) is:

(VII)

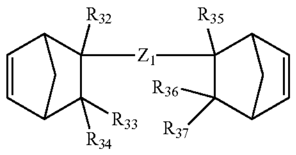

wherein:

$Z_1$ is selected from the group consisting of substituted or unsubstituted $(C_1\text{-}C_{12})$alkylene, $-(CH_2)_dO(CH_2)_e-$, $-(CH_2)_d(SiR_{38}R_{39})(OSiR_{40}R_{41})_f(CH_2)_e-$ where d, e and f are independently integers from 0 to 6, inclusive, $R_{38}$, $R_{39}$, $R_{40}$ and $R_{41}$ are the same or different and independently of each other selected from methyl, ethyl, linear or branched $(C_3\text{-}C_{12})$alkyl, and an arylene selected from the following:

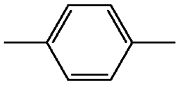
,

-continued

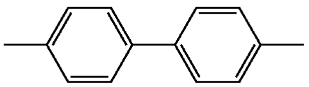
and

;

$R_{32}$, $R_{33}$, $R_{34}$, $R_{35}$, $R_{36}$ and $R_{37}$ are the same or different and independently of each other selected from hydrogen, halogen and hydrocarbyl, where hydrocarbyl is selected from methyl, ethyl, linear or branched $(C_3\text{-}C_{12})$alkyl, $(C_3\text{-}C_{12})$cycloalkyl, $(C_6\text{-}C_{12})$bicycloalkyl, $(C_7\text{-}C_{14})$tricycloalkyl, $(C_6\text{-}C_{10})$aryl, $(C_6\text{-}C_{10})$aryl$(C_1\text{-}C_3)$alkyl, $(C_1\text{-}C_{12})$alkoxy, $(C_3\text{-}C_{12})$cyclo alkoxy $(C_6\text{-}C_{12})$bicyclo alkoxy, $(C_7\text{-}C_{14})$tricycloalkoxy, $(C_6\text{-}C_{10})$aryloxy $(C_1\text{-}C_3)$alkyl or $(C_6\text{-}C_{10})$-aryloxy.

The monomers of formula (VII) are bifunctional monomers and may exhibit high refractive index especially when $Z_1$ is an arylene group. Accordingly, it is contemplated that incorporation of monomers of formula (VII) into composition of this invention generally increases the refractive index of the composition and also increase crosslinkability with other molecules. Thus, by incorporation of monomers of formula (VII) into the composition of this invention it may be possible to increase compatibility with other materials depending upon the intended application thereby enhancing the properties of the composition of the invention.

In another aspect of this invention it is conceivable that the composition of this invention may contain only one monomer of formula (V). That is, any one of the monomers of formulae (VI) or (VII) may be used as needed in the composition of this invention along with at least one monomer of formula (V). In some other embodiments the composition of this invention encompasses two monomers, i.e., one monomer of formula (V) in combination with one monomer of formula (VI) or (VII) and in any desirable proportions. In some other embodiments the composition of this invention encompasses any three monomers of formulae (V) to (VII) in any combinations thereof and in any desirable proportions, provided at least some amounts of monomer of formula (V) is present. All such possible permutations and combinations of monomers of formulae (V) to (VII) are part of this invention.

Accordingly, any of the monomers within the scope of monomer of formula (V) can be employed in the composition of the invention. Representative examples of monomer of formula (V) include the following without any limitations:

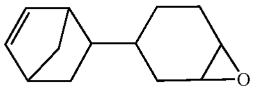

3-(bicyclo[2.2.1]hept-5-en-2-yl)-7-oxabicyclo[4.1.0]heptane (CHEpNB);

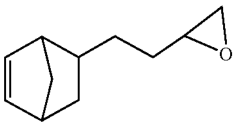

2-(2-(bicyclo[2.2.1]hept-5-en-2-yl)ethyl)oxirane (EBNB);

-continued

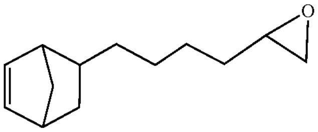

2-(4-bicyclo[2.2.1]hept-5-en-2-yl)butyl)oxirane (EHNB);

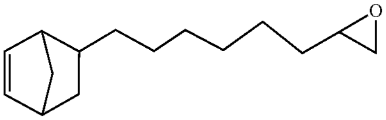

2-(6-bicyclo[2.2.1]hept-5-en-2-yl)hexyl)oxirane (EONB);

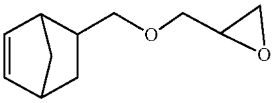

2-((bicyclo[2.2.1]hept-5-en-2-ylmethoxy)methyl)oxirane (MGENB);

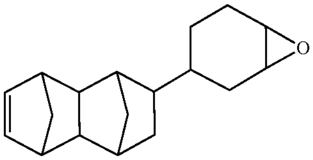

3-(1,2,3,4,4a,5,8,8a-octahydro-1,4:5,8-dimethanonaphthalen-2-yl)-7-oxabicyclo[4.1.0]heptane (CHEpTD);

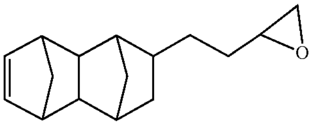

2-(2-(1,2,3,4,4a,5,8,8a-octahydro-1,4:5,8-dimethanonaphthalen-2-yl)ethyl)oxirane (EBTD);

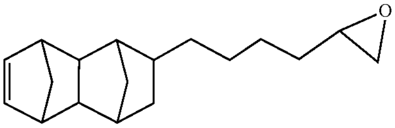

2-(4-(1,2,3,4,4a,5,8,8a-octahydro-1,4:5,8-dimethanonaphthalen-2-yl)butyl)oxirane (EHTD); and

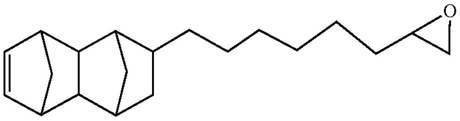

2-(6-(1,2,3,4,4a,5,8,8a-octahydro-1,4:5,8-dimethanonaphthalen-2-yl)hexyl)oxirane (EOTD).

Non-limiting examples of monomers of formula (VI) may be enumerated as follows:

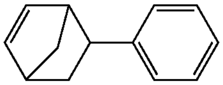

5-phenylbicyclo[2.2.1]hept-2-ene (PhNB);

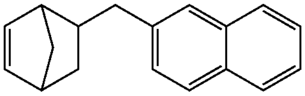

2-(bicyclo[2.2.1]hept-5-en-2-ylmethyl)naphthalene;

-continued

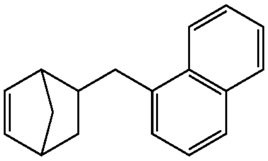

1-(bicyclo[2.2.1]hept-5-en-2-ylmethyl)naphthalene;

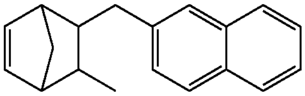

2-((3-methylbicyclo[2.2.1]hept-5-en-2-yl)methyl)naphthalene;

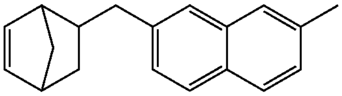

2-(bicyclo[2.2.1]hept-5-en-2-ylmethyl)-7-methylnaphthalene;

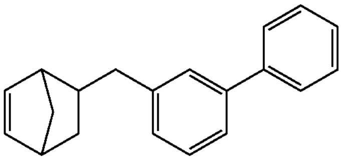

5-([1,1′-biphenyl]-3-ylmethyl)bicyclo[2.2.1]hept-2-ene;

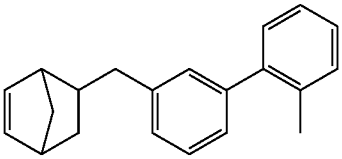

5-((2′-methyl-[1,1′-biphenyl]-3-yl)methyl)bicyclo[2.2.1]hept-2-ene;

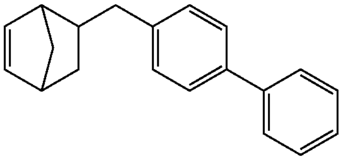

5-([1,1′-biphenyl]-4-ylmethyl)bicyclo[2.2.1]hept-2-ene:

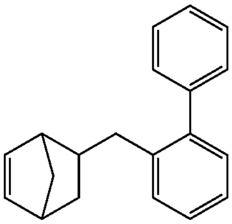

5-([1,1′-biphenyl]-2-methyl)bicyclo[2.2.1]hept-2-ene;

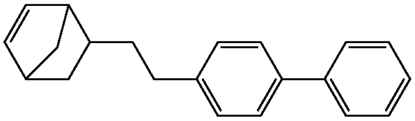

5-(2-([1,1′-biphenyl]-4-yl)ethyl)bicyclo[2.2.1]hept-2-ene (NBEtPhPh);

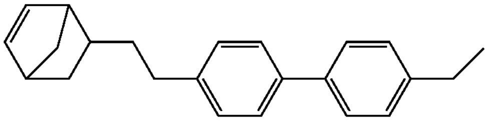

5-(2-(4′-ethyl-[1,1′-biphenyl]-4-yl)ethyl)bicyclo[2.2.1]hept-2-ene;

-continued

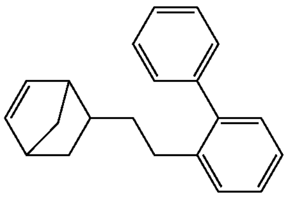

5-(2-([1,1′-biphenyl]-2-yl)ethyl)bicyclo[2.2.1]hept-2-ene;

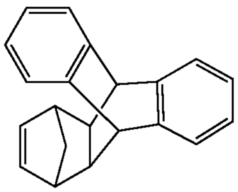

(9R,10S,11R,12S)-9,10-dihydro-9,10-[2]bicycloanthracene;

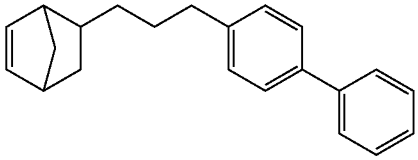

5-(3-([1,1′-biphenyl]-4-yl)propyl)bicyclo[2.2.1]hept-2-ene;

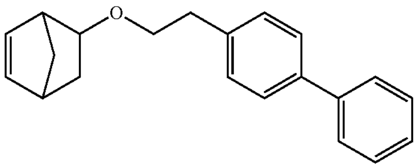

5-(2-([1,1′-biphenyl]-4-yl)ethoxy)bicyclo[2.2.1]hept-2-ene;

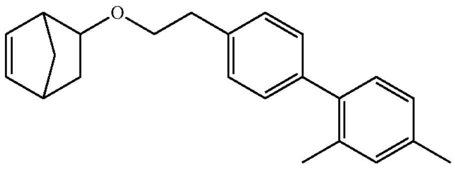

5-(2-(2′,4′-dimethyl-[1,1′-biphenyl]-4-yl)bicyclo[2.2.1]hept-2-ene;

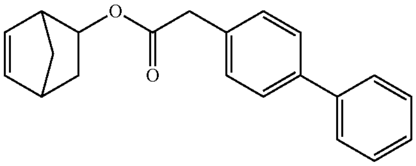

bicyclo[2.2.1]hept-5-en-2-yl 2-([1,1′-biphenyl]-4-yl)acetate;

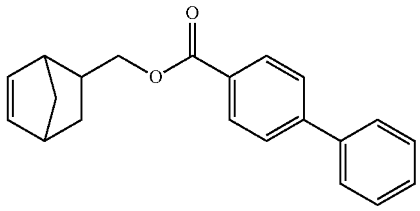

bicyclo[2.2.1]hept-5-en-2-ylmethyl [1,1′-biphenyl]-4-carboxylate;

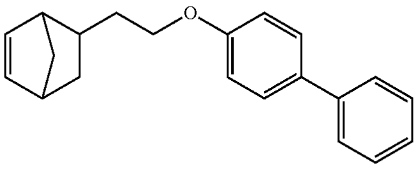

5-(2-([1,1′-biphenyl]-4-yloxy)ethyl)bicyclo[2.2.1]hept-2-ene;

-continued

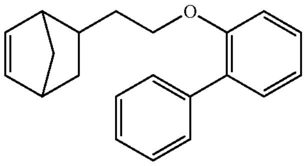

5-(2-([1,1′-biphenyl]-2-yloxy)ethyl)bicyclo[2.2.1]hept-2-ene (NBEtOPhPh);

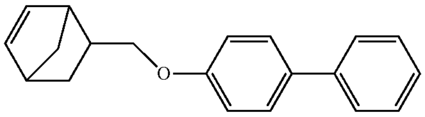

5-(2-([1,1′-biphenyl]-4-yloxy)methyl)bicyclo[2.2.1]hept-2-ene;

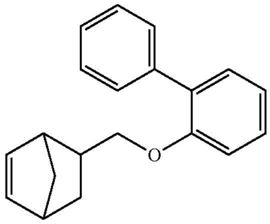

5-(2-([1,1′-biphenyl]-2-yloxy)methyl)bicyclo[2.2.1]hept-2-ene (NBMeOPhPh);

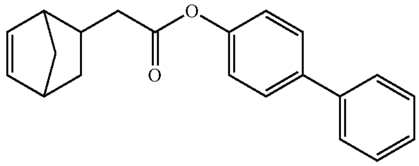

[1,1′-biphenyl]-4-yl 2-(bicyclo[2.2.1]hept-5-en-2-yl)acetate;

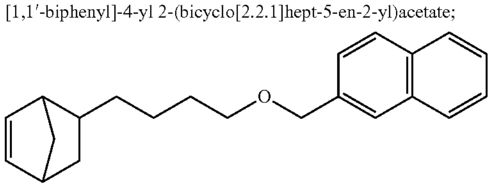

2-((4-(bicyclo[2.2.1]hept-5-en-2-yl)butoxy)methyl)napthalene;

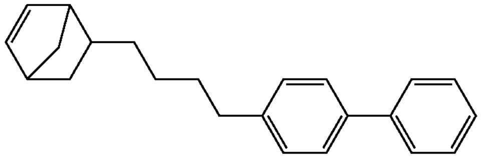

5-(4-([1,1′-biphenyl]-4-yl)butyl)bicyclo[2.2.1]hept-2-ene;

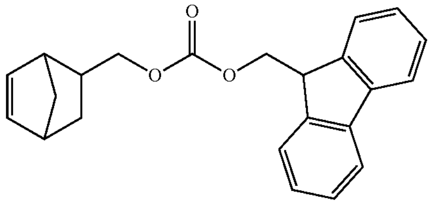

(9H-fluoren-9-yl)methyl (bicyclo[2.2.1]hept-5-en-2-ylmethyl) carbonate;

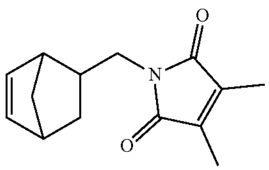

1-(4-bicyclo[2.2.1]hept-5-en-2-ylmethyl)-3,4-dimethyl-1H-pyrrole-2,5-dione (MeDMMINB);

-continued

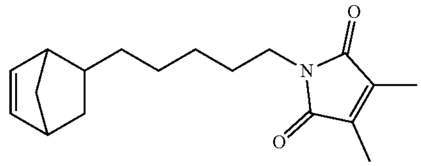

1-(4-bicyclo[2.2.1]hept-5-en-2-ylpentyl)-3,4-dimethyl-1H-pyrrole-2,5-dione (PentylDMMINB);

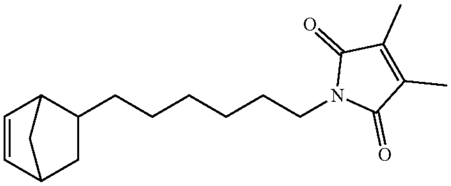

1-(4-bicyclo[2.2.1]hept-5-en-2-ylhexyl)-3,4-dimethyl-1H-pyrrole-2,5-dione (HxDMMINB);

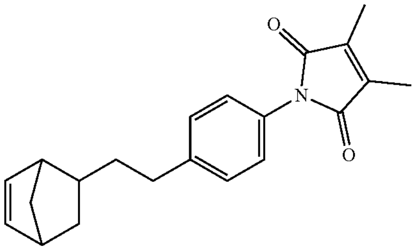

1-(4-bicyclo[2.2.1]hept-5-en-2-ylethyl)1,4-phenylene-3,4-dimethyl-1H-pyrrole-2,5-dione (EtPhDMMINB);

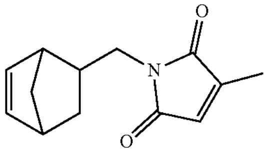

1-(4-bicyclo[2.2.1]hept-5-en-2-ylmethyl)-3-methyl-1H-pyrrole-2,5-dione (MeMMINB);

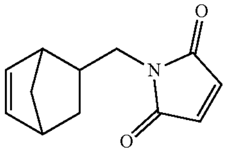

1-(4-bicyclo[2.2.1]hept-5-en-2-ylmethyl)-1H-pyrrole-2,5-dione (MeMINB);

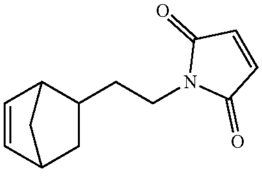

1-(4-bicyclo[2.2.1]hept-5-en-2-ylethyl)-1H-pyrrole-2,5-dione (EtMINB);

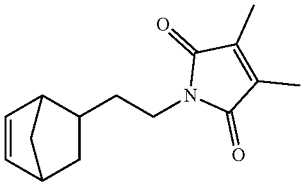

1-(4-bicyclo[2.2.1]hept-5-en-2-ylethyl)-3,4-dimethyl-1H-pyrrole-2,5-dione;

-continued

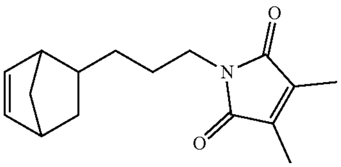

1-(4-bicyclo[2.2.1]hept-5-en-2-ylpropyl)-3,4-dimethyl-1H-pyrrole-2,5-dione;

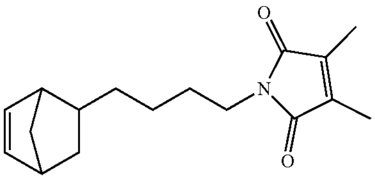

1-(4-bicyclo[2.2.1]hept-5-en-2-ylbutyl)-3,4-dimethyl-1H-pyrrole-2,5-dione;

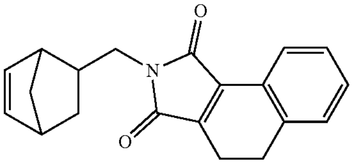

NBDHNMI;

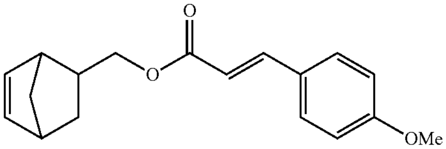

bicyclo[2.2.1]hept-5-en-2-ylmethyl 4-methoxy-cinnamate (NBMeMeOCinn);

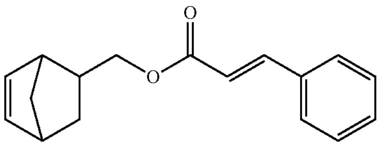

bicyclo[2.2.1]hept-5-en-2-ylmethyl cinnamate (NBMeCinn);

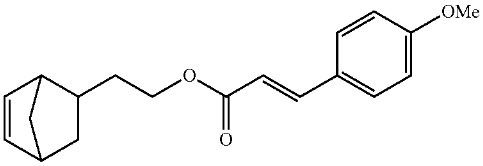

bicyclo[2.2.1]hept-5-en-2-ylethyl 4-methoxy-cinnamate (NBEtMeOCinn);

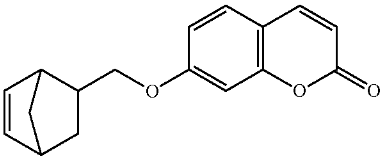

7-(bicyclo[2.2.1]hept-5-en-2-ylmethoxy)-2H-chromen-2-one (NBMeCoum);

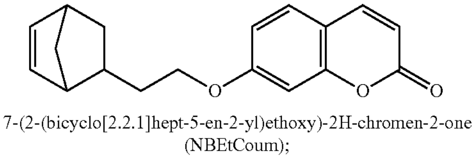

7-(2-(bicyclo[2.2.1]hept-5-en-2-yl)ethoxy)-2H-chromen-2-one (NBEtCoum);

-continued

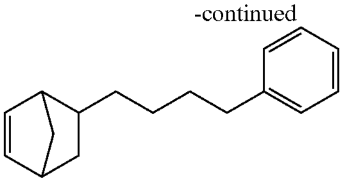

5-(4-phenylbutyl)bicyclo[2.2.1]hept-2-ene;

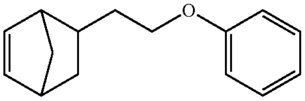

5-(2-phenoxyethyl)bicyclo[2.2.1]hept-2-ene;

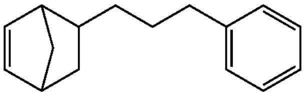

5-(3-phenylpropyl)bicyclo[2.2.1]hept-2-ene;

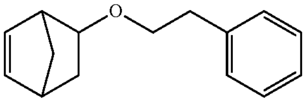

5-phenethoxybicyclo[2.2.1]hept-2-ene;

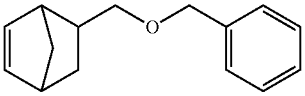

5-((benzyloxy)methyl)bicyclo[2.2.1]hept-2-ene;

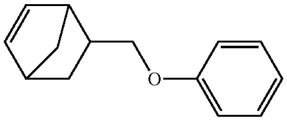

5-(phenoxymethyl)bicyclo[2.2.1]hept-2-ene;

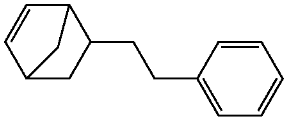

5-phenethylbicyclo[2.2.1]hept-2-ene;

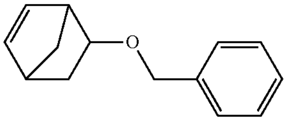

5-(benzyloxy)bicyclo[2.2.1]hept-2-ene;

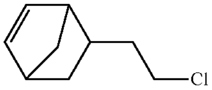

5-(2-chloroethyl)bicyclo[2.2.1]hept-2-ene (NBEtCl);

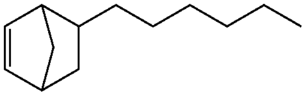

5-hexylbicyclo[2.2.1]hept-2-ene (HexNB);

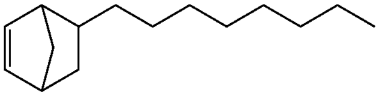

5-octylbicyclo[2.2.1]hept-2-ene (OctNB);

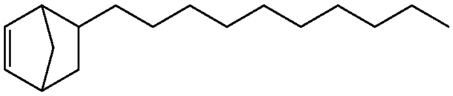

5-decylbicyclo[2.2.1]hept-2-ene (DecNB);

-continued

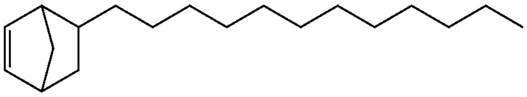

5-dodecylbicyclo[2.2.1]hept-2-ene (DoDecNB);

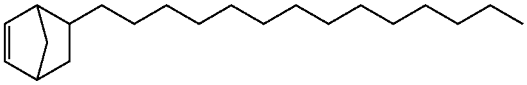

5-tetradecylbicyclo[2.2.1]hept-2-ene (TetraDecNB);

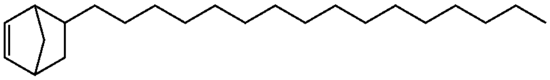

5-hexadecylbicyclo[2.2.1]hept-2-ene (HexadecylNB);

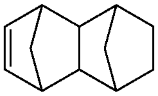

tetracyclododecene (TD);

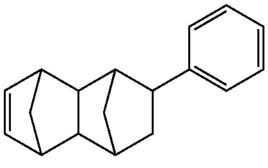

2-phenyl-tetracyclododecene (PhTD);

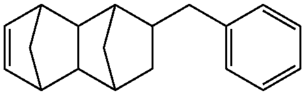

2-benzyl-1,2,3,4,4a,5,8,8a-octahydro-1,4:5,8-dimethanonaphthalene;

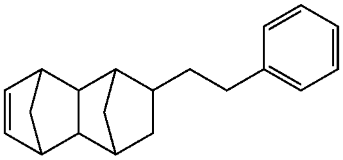

2-phenethyl-1,2,3,4,4a,5,8,8a-octahydro-1,4:5,8-dimethanonaphthalene (PETD);

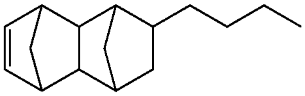

2-butyl-1,2,3,4,4a,5,8,8a-octahydro-1,4:5,8-dimethanonaphthalene (PETD);

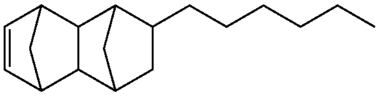

2-hexyl-1,2,3,4,4a,5,8,8a-octahydro-1,4:5,8-dimethanonaphthalene (HexylTD);

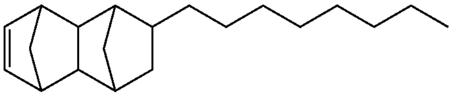

2-octyl-1,2,3,4,4a,5,8,8a-octahydro-1,4:5,8-dimethanonaphthalene (OctylTD);

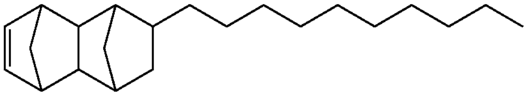

2-decyl-1,2,3,4,4a,5,8,8a-octahydro-1,4:5,8-dimethanonaphthalene (DecylTD);

-continued

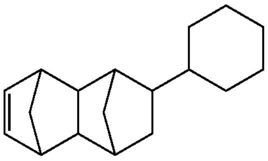

2-cyclohexyl-tetracyclododecene (CyclohexylTD);

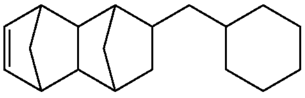

2-cyclohexylmethyl-1,2,3,4,4a,5,8,8a-octahydro-1,4:5,8-dimethanonaphthalene;

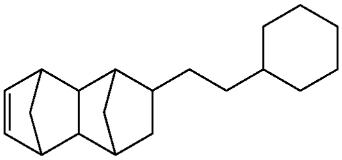

2-cyclohexylethyl-1,2,3,4,4a,5,8,8a-octahydro-1,4:5,8-dimethanonaphthalene; and

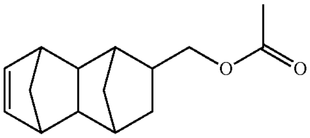

(1,2,3,4,4a,5,8,8a-octahydro-1,4:5,8-dimethanonaphthalen-2-yl) methyl acetate (TDMeOAc).

Again, it should be noted that any of the aforementioned monomers of formulae (V) or (VI) can be used as one or more monomers in any combination thereof in the compositions of this invention, provided however that some amounts of monomer of formula (V) is always present to obtain the benefits afforded by this invention. All such permissible combinations are part of this invention.

Turning now to monomer of formula (VII) to form the composition of this invention it is contemplated that any monomer within the scope of monomer of formula (VII) can be employed. Exemplary monomers of such type include but not limited to those selected from the group consisting of:

1,4-di(bicyclo[2.2.1]hept-5-en-2-yl)benzene;

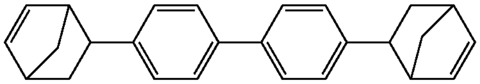

4,4′-di(bicyclo[2.2.1]hept-5-en-2-yl)-1,1′-biphenyl;

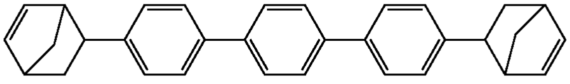

4,4″-di(bicyclo[2.2.1]hept-5-en-2-yl)-1,1′:4′,1″-terphenyl;

-continued

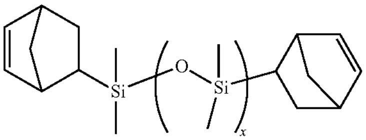

1,3-di(bicyclo[2.2.1]hept-5-en-2-yl)-1,1,3,3-tetramethyldisiloxane (BisNBEt-Disiloxane), when x = 1 and 1,5-di(bicyclo[2.2.1]hept-5-en-2-yl)-1,1,3,3,5,5-hexamethyltrisiloxane (BisNBEt-Trisiloxane)., when x = 2;

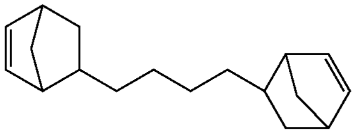

1,4-di(bicyclo[2.2.1]hept-5-en-2-yl)butane;

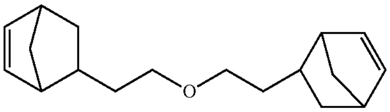

5,5′-(oxybis(ethane-2,1-diyl))bis(bicyclo[2.2.1]hept-2-ene); and

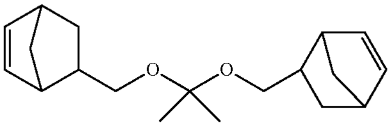

5,5¢-((propane-2,2-diylbis(oxy))bis(methylene))bis(bicyclo [2.2.1]hept-2-ene.

In a further embodiment, the composition of this invention encompasses at least one monomer of formula (V) and one or more monomers of formula (VI).

In another embodiment, the composition of this invention encompasses one or more monomers of formula (V) and at least one monomer of formula (VII) and optionally one monomer of formula (VI).

In yet a further embodiment, the composition of this invention encompasses at least one monomer of formula (V) and at least one monomer of formula (VI), and optionally one monomer of formula (VII).

In yet a further embodiment, the composition of this invention encompasses one monomer of formula (V), optionally one or more monomers of formula (VI) or monomer of formula (VII).

In yet another embodiment, the composition of this invention may include one or more monomers selected from the following:

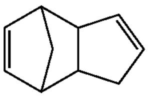

dicyclopentadiene (DCPD);

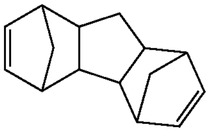

4,4a,4b,5,8,8a,9,9a-octahydro-1H-1,4:5,8-dimethanofluorene (one of trimers of cyclopentadiene, TCPD2);

-continued

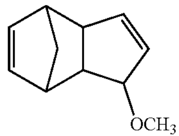

1-methoxy-dicyclopentadiene;

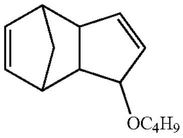

1-(n-butoxy)-dicyclopentadiene;

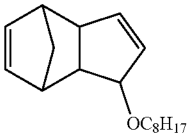

1-(n-octyloxy)-dicyclopentadiene;

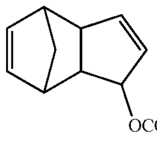

3a,4,7,7a-tetrahydro-1H-4,7-methanoinden-1-yl acetate;

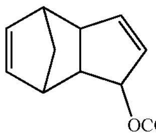

3a,4,7,7a-tetrahydro-1H-4,7-methanoinden-1-yl benzoate;

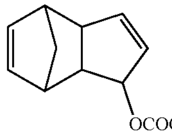

3a,4,7,7a-tetrahydro-1H-4,7-methanoinden-1-yl 2-phenylacetate; and

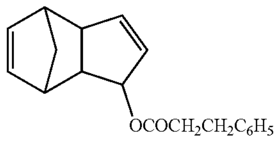

3a,4,7,7a-tetrahydro-1H-4,7-methanoinden-1-yl 3-phenylpropanoate.

In a further embodiment of this invention, the composition contains any of the organoruthenium compound of formula (I) or (II) that would bring about the mass polymerization as described herein. Several of the organoruthenium compound of formula (I) or (II) that is suitable to be employed in the compositions of this invention are known in the literature or can be readily made by any of the known procedures in the art. See for example, U. S. Patent Appln. Publn. No. 2021/0077988 A1, pertinent portions of which are incorporated herein by reference.

In some embodiments the organoruthenium compound is an organo-ruthenium carbide of formula (IA):

(IA)

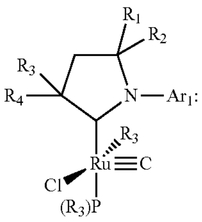

wherein:

each R is independently selected from the group consisting of isopropyl, sec-butyl, tert-butyl, cyclohexyl and phenyl;

each $R_1$, $R_2$, $R_3$ and $R_4$ is independently selected from the group consisting of hydrogen, methyl, ethyl, n-propyl, iso-propyl and phenyl;

$Ar_1$ is selected from the group consisting of 2,4-dimethylphenyl, 2,4-diethylphenyl, 2,4-diisopropylphenyl and 2,4,6-trimethylphenyl.

Generally, any of the latent organo-ruthenium carbide catalyst that would bring about ring open metathesis polymerization of the monomers of formula (V) and monomer of formula (VI) as well as monomer of formula (VII), if present, can be employed in the composition of this invention. More specifically, organo-ruthenium carbide compounds that show little or no activity at ambient temperatures can be employed. That is, the latent catalysts that are stable at or near room temperature are more suitable in the composition of this invention. The latent catalysts may be activated by a variety of conditions, including without any limitation acid and chemical activation. The chemical activation may include use of thermal acid generators or photo acid generators.

Exemplary organoruthenium compound of formula (I) that can be employed in the composition of this invention without any limitation include the following:

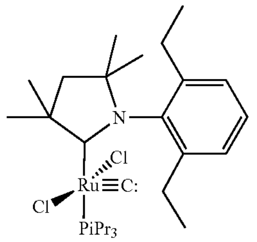

(1-(2,6-diethylphenyl)-3,3,5,5-tetramethylpyrrolidin-2-yl) (tris-isopropylphosphine)ruthenium carbide dichloride (Ru1);

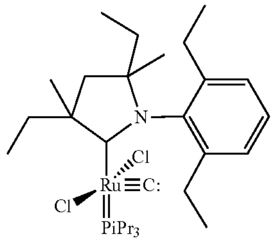

(1-(2,6-diethylphenyl)-3,5-dimethyl-3,5-diethylpyrrolidin-2-yl) (tris-isopropylphosphine)ruthenium carbide dichloride;

-continued

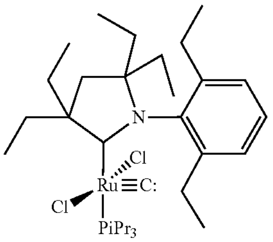

(1-(2,6-diethylphenyl)-3,3,5,5-tetraethylpyrrolidin-2-yl) (tris-isopropylphosphine)ruthenium carbide dichloride;

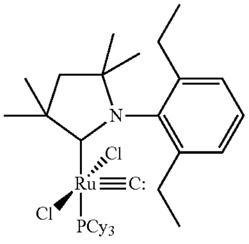

(1-(2,6-diethylphenyl)-3,3,5,5-tetramethylpyrrolidin-2-yl) (tri-cyclohexylphosphine)ruthenium carbide dichloride;

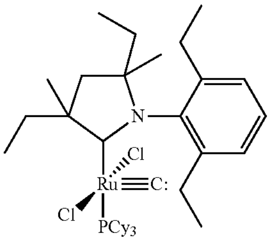

(1-(2,6-diethylphenyl)-3,5-dimethyl-3,5-diethylpyrrolidin-2-yl) (tri-cyclohexylphosphine) ruthenium carbide dichloride;

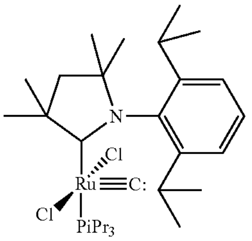

1-(2,6-diisopropylphenyl)-3,3,5,5-tetramethylpyrrolidin-2-ylidene-triisopropylphosphine ruthenium carbide dichloride.

Exemplary organoruthenium compound of formula (II) that can be employed in the composition of this invention without any limitation include the following:

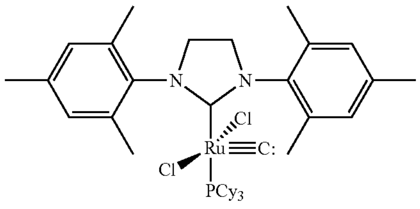

1,3-bis(2,4,6-trimethylphenyl)-imidazolidin-2-ylidene-tricyclohexylphosphine-ruthenium carbide dichloride;

-continued

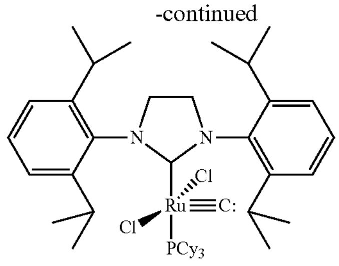

1,3-bis(2,6-diisopropylphenyl)-imidazolidin-2-ylidene-tricyclohexylphosphine-ruthenium carbide dichloride;

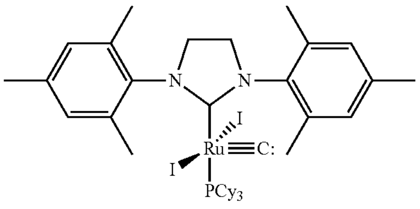

1,3-bis(2,4,6-trimethylphenyl)-imidazolidin-2-ylidene-tricyclohexylphosphine-ruthenium carbide diiodide;

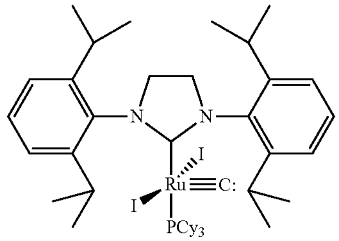

1,3-bis(2,6-diisopropylphenyl)-imidazolidin-2-ylidene-tricyclohexylphosphine-ruthenium carbide diiodide.

As noted, the composition of this invention further contains a photoacid generator which when combined with the organoruthenium compound of formula (I) or (II) and a photosensitizer will cause mass polymerization of the monomers contained therein when exposed to suitable radiation as described herein. Any of the known photoacid generators can be used in the compositions of this invention, such as for example, certain of the halonium salts.

In some embodiments the photoacid generator of the formula ($IV_a$) are employed in the composition of this invention:

$$Aryl_1\text{-}Hal^{\oplus}\text{-}Aryl_2An^{\ominus} \quad (IV_a)$$

Wherein $Aryl_1$ and $Aryl_2$ are the same or different and are independently selected from the group consisting of substituted or unsubstituted phenyl, biphenyl and naphthyl; Hal is iodine or bromine; and $An^{\ominus}$ is a weakly coordinating anion (WCA) which is weakly coordinated to the cation complex. More specifically, the WCA anion functions as a stabilizing anion to the cation complex. The WCA anion is relatively inert in that it is non-oxidative, non-reducing, and non-nucleophilic. In general, the WCA can be selected from borates, phosphates, arsenates, antimonites, aluminates, boratabenzene anions, carborane, halocarborane anions, sulfonamidate and sulfonates Representative examples of the compounds of formula ($IV_a$) may be listed as follows:

($IV_b$)

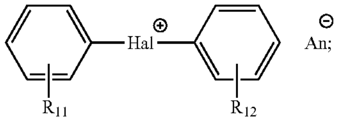

($IV_c$)

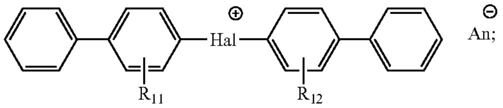

and

-continued ($IV_d$)

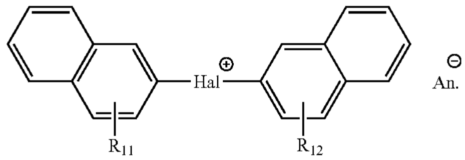

Wherein $R_{11}$ and $R_{12}$ are as defined herein. Similarly various sulfonium salts can be used as photoacid generators, which include broadly compounds of formula (III) as described herein.

Accordingly, non-limiting examples of suitable photoacid generators of formula (III) that may be employed in the composition of this invention are listed below:

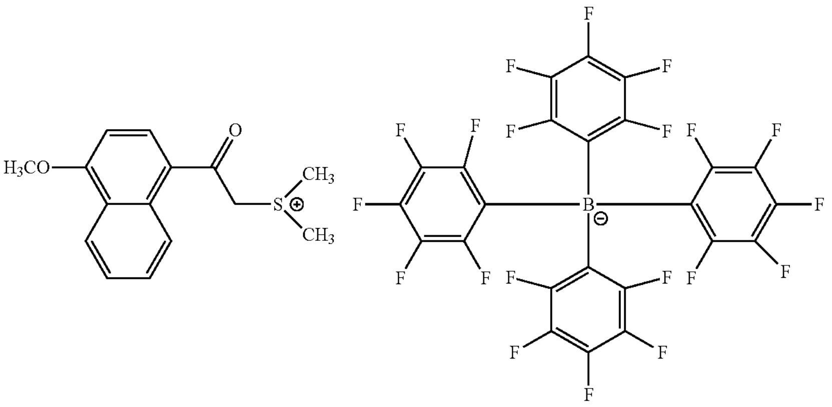

(2-(4-methoxynaphthalen-1-yl)-2-oxoethyl)dimethylsulfonium tetrakis(perfluorophenyl)borate, commercially available as TAG 382;

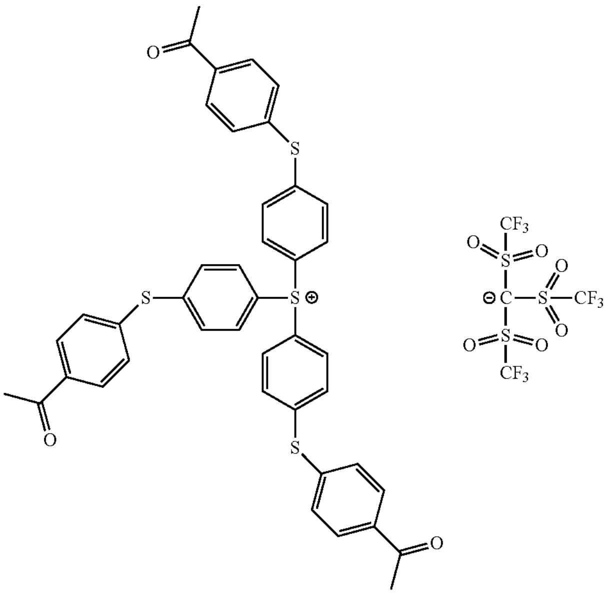

tris(4-((4-acetylphenyl)thio)phenyl)sulfonium tris((trifluoromethyl)sulfonyl)methanide;

-continued
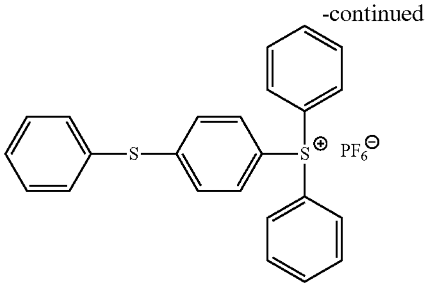
(4-thiophenyl)phenyl-diphenylsulfonium hexafluorophosphate;
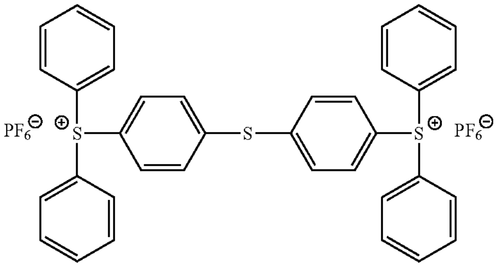
bis-(triphenylsulfonium) sulfide bis-hexafluorophosphate;
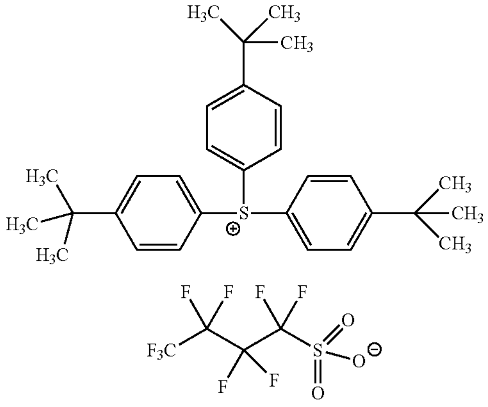
tris(4-tert-butylphenyl)sulfonium perfluoro-1-butanesulfonate;
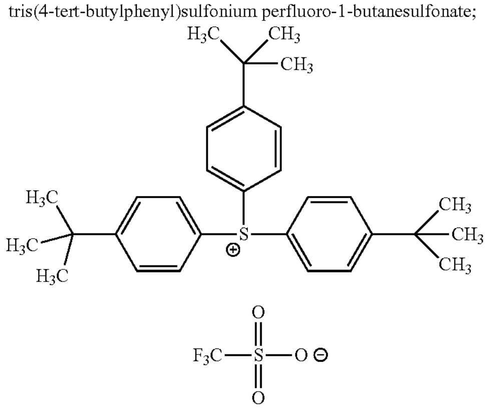
tris(4-tert-butylphenyl)sulfonium triflate;
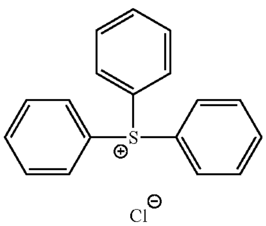
triphenylsulfonium chloride;

-continued

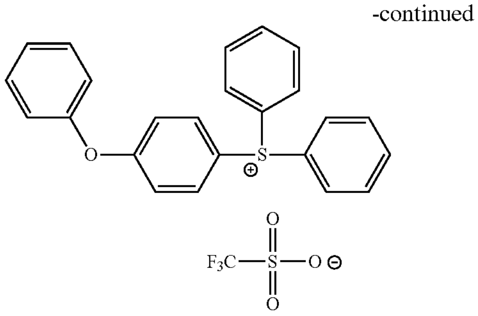

(4-phenoxyphenyl)diphenylsulfonium triflate; and

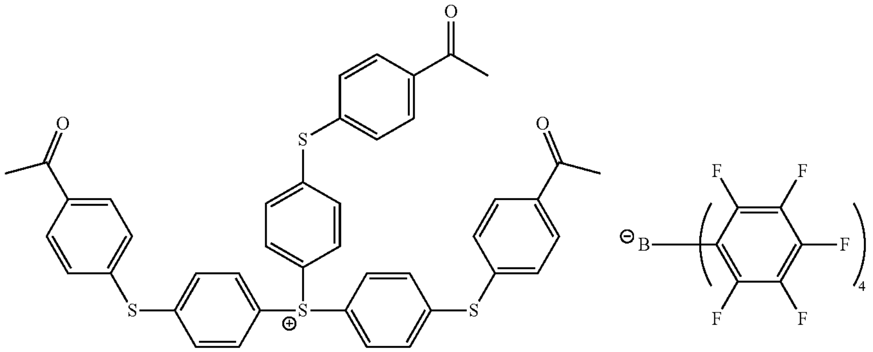

tris(4-((4-acetylphenyl)thio)phenyl)sulfonium tetrakis-pentafluorophenylborate (Irgacure PAG290).

Non-limiting examples of suitable photoacid generators of formula (IV) that may be employed in the composition of this invention are listed below:

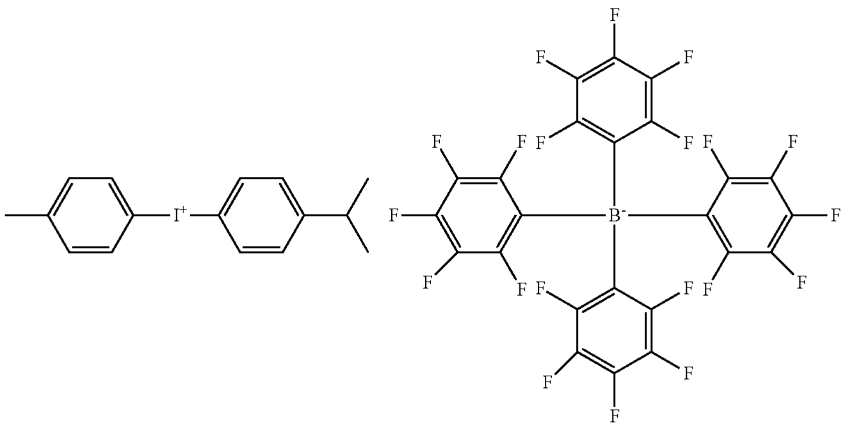

tolylcumyliodonium-tetrakis pentafluorophenylborate, commerically available under the tradename Bluesil PI 2074® from Elkem Silicones;

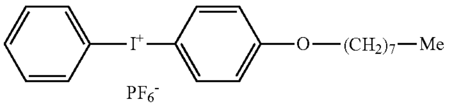

[4-(octyloxy)phenyl]-phenyliodonium (hexafluoro)phosphate (OPPI $PF_6$);

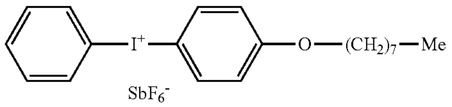

[4-(octyloxy)phenyl]-phenyliodonium (hexafluoro)antimonate (OPPI $SbF_6$);

-continued
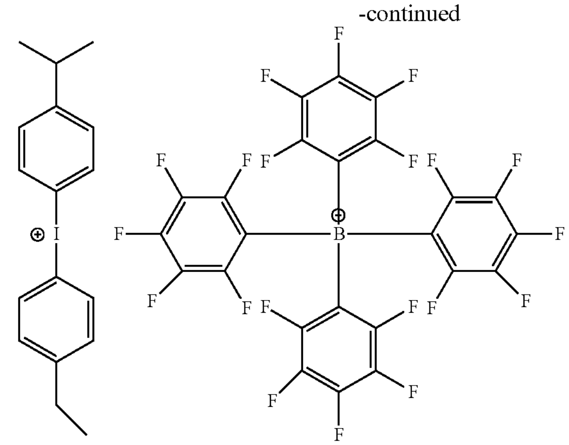
(4-ethylphenyl)(4-isopropylphenyl)iodonium tetrakis(perfluorophenyl)borate;
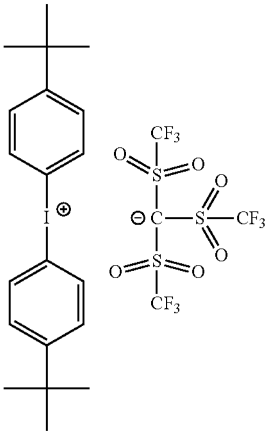
di-(p-t-butylphenyl)iodonium tris(trifluoromethanesulfonyl)methanide;
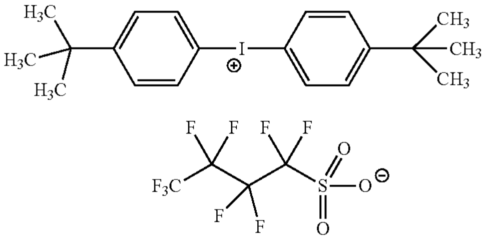
bis(4-tert-butylphenyl)iodonium perfluoro-1-butanesulfonate;
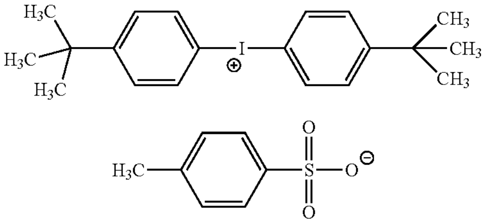
bis(4-tert-butylphenyl)iodonium p-toluenesulfonate;
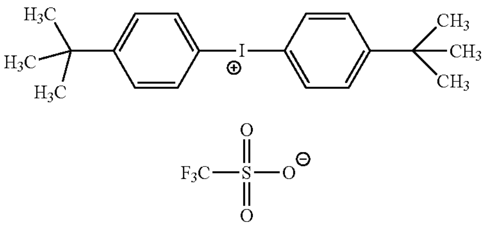
bis(4-tert-butylphenyl)iodonium triflate;

-continued

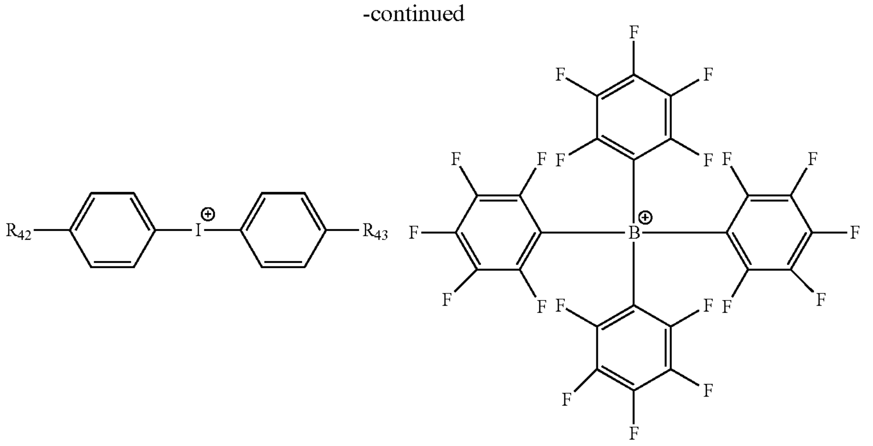

where $R_{42}$ and $R_{43}$ are the same or different and each independently selected from linear or branched ($C_{10}$-$C_{13}$)alkyl, for example iodonium, diphenyl-, 4,4'-di-$C_{10}$-$C_{13}$-alkyl derivatives, tetrakis(2,3,4,5,6-pentafluorophenyl)borates are commercially available under the tradename SILCOLEASE UV CATA 243; and

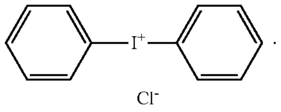

diphenyliodonium chloride

Other exemplary PAGs that may be suitable in the composition of this invention include the following:

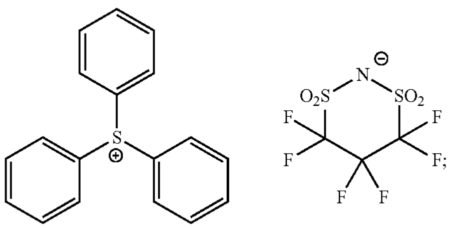

triphenylsulfonium 4,4,5,5,6,6-hexafluoro-1,3,2-dithiazinan-2-ide 1,1,3,3-tetraoxide -continued

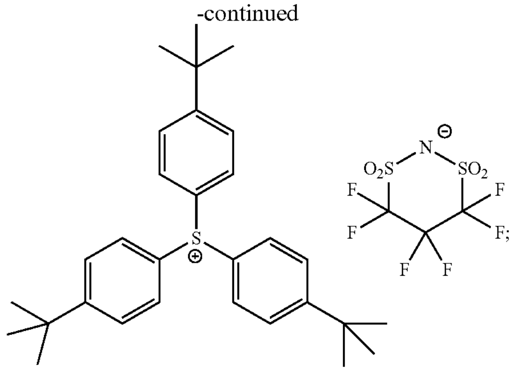

tris(4-(tert-butyl)phenyl)sulfonium 4,4,5,5,6,6-hexafluoro-1,3,2-diathiazinan-2-ide 1,1,3,3-tetraoxide

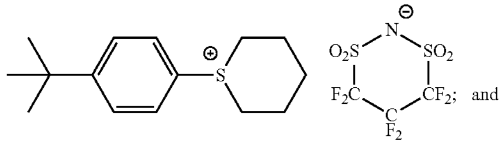

and 1-(4-(tert-butyl)phenyl)hexahydrothiopyrylium 4,4,5,5,6,6-hexafluoro-1,3,2-dithiazinan-2-ide 1,1,3,3-tetraoxide

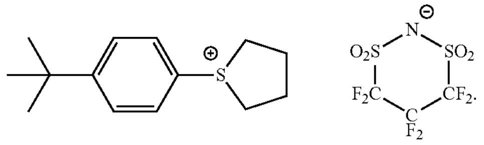

1-(4-(tert-butyl)phenyl)tetrahydro-1H-thiophen-1-ium 4,4,5,5,6,6-hexafluoro-1,3,2-dithiazinan-2-ide 1,1,3,3-tetraoxide However, any of the other known photoacid generators which can activate the organoruthenium compound of formula (I) or (II) as employed herein when exposed to suitable radiation can also be used in the composition of this invention. All such compounds are part of this invention.

As noted, the composition of this invention additionally contains a photosensitizer compound which further facilitates the formation of the active catalyst when the composition is exposed to suitable radiation in the presence of the photoacid generator as employed herein. For this purpose, any suitable sensitizer compound can be employed in the compositions of the present invention, which activates the photoacid generator and/or the organoruthenium compound of formula (I) or (II). Such suitable sensitizer compounds include, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include a compound of formula (VIII) or a compound of formula (IX):

(VIII)

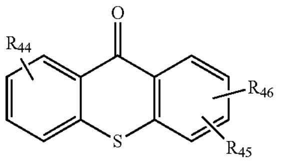

(IX)

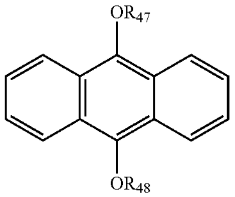

wherein $R_{44}$, $R_{45}$ and $R_{46}$ are the same or different and independently of each other selected from the group consisting of hydrogen, halogen, hydroxy, $NO_2$, $NH_2$, methyl, ethyl, linear or branched $(C_3\text{-}C_{12})$alkyl, $(C_3\text{-}C_{12})$cycloalkyl, $(C_6\text{-}C_{12})$bicycloalkyl, $(C_7\text{-}C_{14})$tricycloalkyl, $(C_6\text{-}C_{10})$aryl, $(C_6\text{-}C_{10})$aryl$(C_1\text{-}C_3)$alkyl, $(C_1\text{-}C_{12})$alkoxy, $(C_3\text{-}C_{12})$cycloalkoxy, $(C_6\text{-}C_{12})$bicycloalkoxy, $(C_7\text{-}C_{14})$tricycloalkoxy, $(C_6\text{-}C_{10})$aryloxy$(C_1\text{-}C_3)$alkyl, $(C_6\text{-}C_{10})$-aryloxy, $C(O)(C_1\text{-}C_6)$alkyl, COOH, $C(O)O(C_1\text{-}C_6)$alkyl, and $SO_2(C_6\text{-}C_{10})$aryl;

$R_{47}$ and $R_{48}$ are the same or different and independently of each other selected from the group consisting of methyl, ethyl, linear or branched $(C_3\text{-}C_{12})$alkyl, $(C_3\text{-}C_{12})$cycloalkyl, $(C_6\text{-}C_{12})$bicycloalkyl, $(C_7\text{-}C_{14})$tricycloalkyl, $(C_6\text{-}C_{10})$aryl and $(C_6\text{-}C_{10})$aryl$(C_1\text{-}C_3)$alkyl.

Representative examples of the compounds of formula (VIII) or the compounds of formula (IX) without any limitation may be listed as follows:

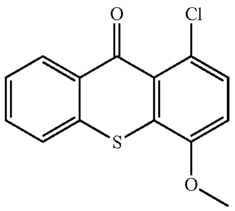
;

1-chloro-4-methoxy-9H-thioxanthen-9-one

-continued

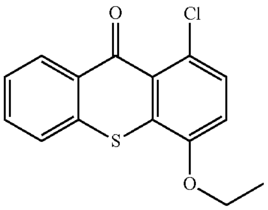
;

1-chloro-4-ethoxy-9H-thioxanthen-9-one

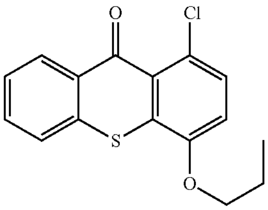
;

1-chloro-4-propoxy-9H-thioxanthen-9-one (commercially sold under the name CPTX from Lambson)

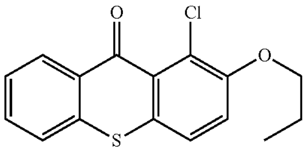
;

1-chloro-2-propoxy-9H-thioxanthen-9-one

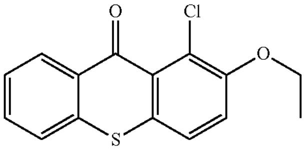
;

1-chloro-2-ethoxy-9H-thioxanthen-9-one

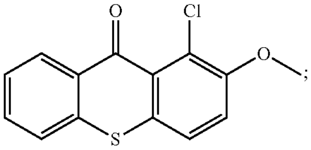
;

1-chloro-2-methoxy-9H-thioxanthen-9-one

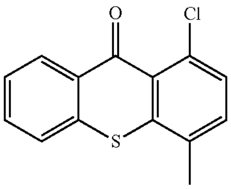
;

1-chloro-4-methyl-9H-thioxanthen-9-one

-continued

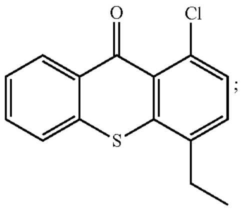

1-chloro-4-ethyl-9H-thioxanthen-9-one

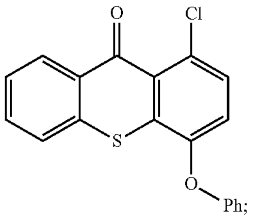

1-chloro-4-phenoxy-9H-thioxanthen-9-one

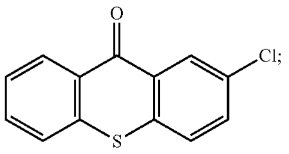

2-chlorothioxanthen-9-one (CTX)

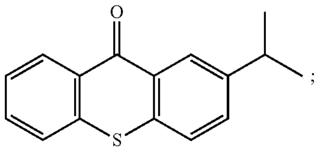

2-isopropyl-9H-thioxanthen-9-one (ITX)

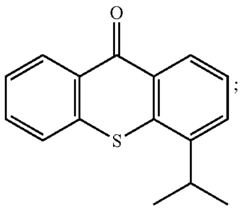

4-isopropyl-9H-thioxanthen-9-one

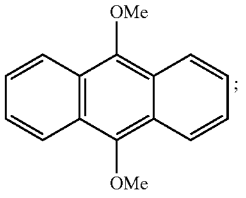

9,10-dimethoxyanthracene (DMA)

-continued

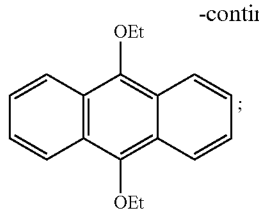

and 9,10-diethoxyanthracene (DEA)

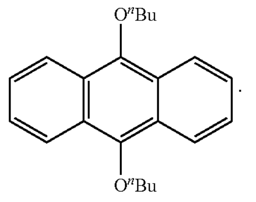

9,10-di-n-butoxyanthracene (DBA)

Other suitable photosensitizer compounds include various substituted and unsubstituted phenothiazine derivatives, such as for example:

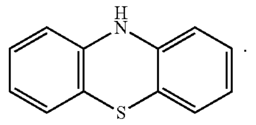

phenothiazine

Generally, photosensitizers absorb energy from the radiated light source and transfers that energy to the desirable substrate/reactant, which in the present invention is the photoacid generator employed in the composition of this invention. In some embodiments the compounds of formula (III) or the compounds of formula (IV) can be activated at certain wavelength of the electromagnetic radiation which can generally range from about 240 nm to 410 nm. Accordingly, any of the compounds which are active in this electromagnetic radiation can be employed in the compositions of this invention which are stable to various fabrications methods where the compositions of this invention can be used including for example OLED or the 3D fabrication methods. In some embodiments the wavelength of the radiation to activate the compounds of formulae (III) or (IV) is 260 nm. In some other embodiments the wavelength of the radiation to activate the compounds of formulae (III) or (IV) is 310 nm. In some other embodiments the wavelength of the radiation to activate the compounds of formulae (III) or (IV) is 365 nm. In yet some other embodiments the wavelength of the radiation to activate the compounds of formulae (III) or (IV) is 395 nm.

Any amount of one or more organoruthenium compound of formula (I) or (II), the photoacid generator of formulae (III) or (IV) and the photosensitizer of formulae (VIII) or (IX) can be employed in the composition of this invention which will bring about the intended result. Generally, the molar ratio of monomer of formula (V):compound of formula (I) or (II) is in the range of 25,000:1 to 5,000:1 or lower. In some other embodiments such monomer of formula (V):compound of formula (I) or (II) is 10,000:1, 15,000:1, 20,000:1 or higher than 30,000:1. It should be noted that monomer of formula (V) as mentioned herein may include one or more monomers of formula (V) distinct from each other and may additionally contain one or more monomers of formulae (VI) or (VII), and therefore, the above ratio represents combined molar amounts of all such monomers employed. Similarly, the molar ratio of organoruthenium compound of formula (I) or (II):the photoacid generator of formulae (III) or (IV):the photosensitizer of formulae (VIII) or (IX) is in the range of 1:1:0.5 to 1:2:2 or 1:2:1 or 1:4:1, 1:2:4, 1:1:2, 1:4:2 or such ranges which will bring about the intended benefit.

Advantageously, it has further been found that the composition according to this invention forms a substantially transparent film when exposed to a suitable actinic radiation (UV irradiation). That is to say that when the composition of this invention is exposed to certain actinic radiation, the monomers undergo mass polymerization to form films which are substantially transparent to visible light. That is, most of the visible light is transmitted through the film. In some embodiments such film formed from the composition of this invention exhibits a transmission of equal to or higher than 90 percent of the visible light. In some other embodiments such film formed from the composition of this invention exhibits a transmission of equal to or higher than 95 percent of the visible light. It should be further noted that any actinic radiation that is suitable to carry out this mass polymerization can be employed, such as for example, exposure to any actinic radiation in the wavelength of 200 nm to 400 nm. However, any radiation higher than 400 nm can also be employed. In some embodiments the wave length of the actinic radiation employed is 250 nm, 295 nm, 360 nm, 395 nm or higher than 400 nm.

In some other embodiments the composition of this invention undergoes mass polymerization when exposed to suitable actinic radiation and heat to form a substantially transparent film. In yet other embodiments the composition of this invention undergoes mass polymerization when exposed to suitable UV irradiation at a temperature from 50° C. to 100° C. to form a substantially transparent film.

Accordingly, exemplary compositions of this invention without any limitation may be enumerated as follows:

2-(4-(bicyclo[2.2.1]hept-5-en-2-yl)butyl)oxirane (EHNB), (1-(2,6-diethylphenyl)-3,3,5,5-tetramethylpyrrolidin-2-yl)(tris-isopropylphosphine)ruthenium carbide dichloride (Ru1), tolylcumyliodonium-tetrakis pentafluorophenylborate (Bluesil PI 2074) and 2-isopropyl-9H-thioxanthen-9-one (ITX);

3-(bicyclo[2.2.1]hept-5-en-2-yl)-7-oxabicyclo[4.1.0]heptane (CHEpNB), (1-(2,6-diethylphenyl)-3,3,5,5-tetramethylpyrrolidin-2-yl)(tris-isopropylphosphine)ruthenium carbide dichloride (Ru1), tolylcumyliodonium-tetrakis pentafluorophenylborate (Bluesil PI 2074) and 2-isopropyl-9H-thioxanthen-9-one (ITX);

5-phenethylbicyclo[2.2.1]hept-2-ene (PENB), 3-(bicyclo[2.2.1]hept-5-en-2-yl)-7-oxabicyclo[4.1.0]heptane (CHEpNB), (1-(2,6-diethylphenyl)-3,3,5,5-tetramethylpyrrolidin-2-yl)(tris-isopropylphosphine)ruthenium carbide dichloride (Ru1), tolylcumyliodonium-tetrakis pentafluorophenylborate (Bluesil PI 2074) and 2-isopropyl-9H-thioxanthen-9-one (ITX); and 2-hexyl-1,2,3,4,4a,5,8,8a-octahydro-1,4:5,8-dimethanonaphthalene (HexylTD), 3-(bicyclo[2.2.1]hept-5-en-2-yl)-7-oxabicyclo[4.1.0]heptane (CHEpNB), (1-(2,6-diethylphenyl)-3,3,5,5-tetramethylpyrrolidin-2-yl)(tris-isopropylphosphine)ruthenium carbide dichloride (Ru1), tolylcumyliodonium-tetrakis pentafluorophenylborate (Bluesil PI 2074) and 2-isopropyl-9H-thioxanthen-9-one (ITX).

In a further aspect of this invention there is provided a kit for forming a substantially transparent film. There is dispensed in this kit a composition of this invention. Accordingly, in some embodiments there is provided a kit in which there is dispensed one or more olefinic monomers containing an epoxy group, such as for example, a monomer of formula (V); an organoruthenium compound of formula (I) or (II) as described herein; a photoacid generator of formulae (III) or (IV) as described herein and a photosensitizer compound of formulae (VIII) or (IX). In some embodiments the kit of this invention contains one or more monomers of formula (V) optionally in combination with one or more monomers of formulae (VI) or (VII) so as to obtain a desirable result and/or for intended purpose.

In some embodiments, the aforementioned kit encompasses one or more monomers of formula (V) and one or more monomers of formulae (VI) or (VII). In some other embodiments the kit of this invention encompasses at least two monomers wherein first monomer serves as a solvent for the second monomer. Any of the monomers of formulae (V) to (VII) as described herein can be used in this embodiment provided however that there is at least one monomer of formula (V) is present as discussed above. The molar ratio of such two monomers contained in these embodiments can vary and may range from 1:99 to 99:1, or 10:90 to 90:10, 20:80 to 80:20, 30:70 to 70:30, 60:40 to 40:60 or 50:50, and so on. In some other embodiments the kit may encompass a composition wherein dispensed two monomers which could be one monomer of formula (V) and another monomer of formula (VI). Further, the monomer of formula (VI) is completely soluble in monomer of formula (V) to form a clear solution at room temperature. In some embodiments the monomer mixture may become a clear solution at slightly elevated temperature, such as for example, 30° C. or 40° C. or 50° C., before they undergo mass polymerization.

In another aspect of this embodiment of this invention the kit of this invention undergoes mass polymerization only when exposed to suitable actinic radiation for a sufficient length of time to form a polymeric film. That is to say that the composition of this invention is poured onto a surface or onto a substrate which needs to be encapsulated and exposed to suitable radiation in order for the monomers to undergo polymerization to form a solid transparent polymer which could be in the form of a transparent film.

Generally, as already noted above, such polymerization can take place at various wavelengths of actinic radiation, such as for example, at 265 nm 315 nm 365 nm or 395 nm and so on. The mass polymerization may further be accelerated by heating, which can also be in stages, for example heating to 40° C. or 50° C. or 60° C. for 5 minutes each, and if necessary further heating to 70° C. for various lengths of time such as from 5 minutes to 15 minutes and so on. By practice of this invention it is now possible to obtain polymeric films on such substrates which are substantially transparent film. The "substantially transparent film" as used herein means that the films formed from the composition of this invention are optically clear in the visible light. Accordingly, in some embodiments of this invention such films are having at least 90 percent of visible light transmission, in some other embodiments the films formed from the composition of this invention exhibit at least 95 percent of visible light transmission.

In some embodiments of this invention the kit as described herein encompasses a composition which further contains one or more monomers of formula (VII) as described hereinabove. Again, any of the monomers of formula (VII) as described herein can be used in this embodiment, and in any desirable amounts depending on the nature of the intended use.

In some embodiments, the kit as described herein encompasses various exemplary compositions as described hereinabove.

In yet another aspect of this invention there is further provided a method of forming a substantially transparent film for the fabrication of a variety of optoelectronic device comprising:

- forming a homogeneous clear composition comprising one or more monomers of formula (V) optionally in combination with one or more monomers of formulae (VI) or (VII); an organoruthenium compound of formula (I) or (II); a photoacid generator of formulae (III) or (IV); and a photosensitizer of formulae (VIII) or (IX);
- coating a suitable substrate with the composition or pouring the composition onto a suitable substrate to form a film; and
- exposing the film to a suitable actinic radiation to cause polymerization of the monomers.

The coating of the desired substrate to form a film with the composition of this invention can be performed by any of the coating procedures as described herein and/or known to one skilled in the art, such as by spin coating. Other suitable coating methods include without any limitation spraying, doctor blading, meniscus coating, ink jet coating and slot coating. The mixture can also be poured onto a substrate to form a film. Suitable substrate includes any appropriate substrate as is, or may be used for electrical, electronic or optoelectronic devices, for example, a semiconductor substrate, a ceramic substrate, a glass substrate.

Next, the coated substrate is exposed to suitable actinic radiation as described herein. Concurrently and/or after exposure the substrate can optionally be baked, i.e., heated to accelerate/complete the mass polymerization, for example to a temperature from 50° C. to 100° C. for about 1 to 60 minutes, although other appropriate temperatures and times can be used. In some embodiments the substrate is baked at a temperature of from about 60° C. to about 90° C. for 2 minutes to 10 minutes. In some other embodiments the substrate is baked at a temperature of from about 60° C. to about 90° C. for 5 minutes to 20 minutes.

The films thus formed are then evaluated for their optical properties using any of the methods known in the art. For example, the refractive index of the film across the visible spectrum can be measured by ellipsometry. The optical quality of the film can be determined by visual observation. Quantitatively the percent transparency can be measured by visible spectroscopy. Generally, the films formed according to this invention exhibit excellent optical transparent properties and can be tailored to desirable refractive index as described herein.

Accordingly, in some of the embodiments of this invention there is also provided an optically transparent film obtained by the mass polymerization of the composition as described herein. In another embodiment there is also provided an optoelectronic device comprising the transparent film of this invention as described herein.

In yet some other embodiments the composition of this invention can also be used in a variety of photo induced nanoimprint lithography (NIL), such as for example, UV-NIL. For instance, the compositions of this invention can be used in a variety of photocurable imprint technology. Typically in such applications, the composition of this invention is suitably placed on a substrate (for example by coating or similar means), which is then covered by a suitable stamp and exposed to radiation so as to allow the composition of this invention to cure to a solid. The stamp is then released to obtain the nano-imprinted film. Such substrates can include for example a master digital video disk (DVD).

Surprisingly, in this aspect of the invention it has now been found that by judicious selection of monomers of formulae (V) optionally in combination with one or more monomers of formulae (VI) or (VII), organoruthenium compound of formula (I) or (II), photoacid generators as described herein and the photosensitizers as described herein it is now possible to form compositions in accordance with this aspect of the invention which feature unique properties. Accordingly, in some embodiments of this aspect of the invention the compositions thus formed exhibit longer storage stabilities, which can extend up to four months or longer at ambient temperatures or temperatures up to 60° C. The compositions of this aspect of the invention are more readily ink jettable as well as spreadable on suitable substrates using any of the known procedures including ink jetting, among other coating methods.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention: CHEpNB—3-(bicyclo[2.2.1]hept-5-en-2-yl)-7-oxabicyclo[4.1.0]heptane; Hexyl TD—2-hexyl-1,2,3,4,4a,5,8,8a-octahydro-1,4:5,8-dimethanonaphthalene; PENB—5-phenethylbicyclo[2.2.1]hept-2-ene; Ru1—(1-(2,6-diethylphenyl)-3,3,5,5-tetramethylpyrrolidin-2-yl)(tris-isopropylphosphine)ruthenium carbide dichloride; Bluesil PI 2074—tolylcumyliodonium-tetrakis pentafluorophenylborate; ITX—4-isopropylthioxanthone; DSC—differential scanning calorimetry; TGA—thermogravimetric analysis; DMA—dynamic mechanical analysis; UV—ultraviolet.

Various monomers as used herein are either commercially available or can be readily prepared following the procedures as described in U.S. Pat. No. 9,944,818.

Various organoruthenium compounds of formula (I) are known in the literature and can be readily prepared following the procedures as described in the literature.

The following Examples demonstrate that the composition of this invention is quite stable at room temperature for several months and yet can very readily be mass polymerized when exposed to UV radiation. The following Examples further demonstrate that the compositions of this invention when used in appropriate quantities provide three dimensional articles exhibiting improved mechanical properties.

Example 1

Mass Polymerization of CHEpNB with Bluesil PI 2074 and Ru1

In a glass bottle, Ru1 (1 molar part), Bluesil PI 2074 (2 molar parts) and ITX (1 molar part) were dissolved in CHEpNB (5000 molar parts) to form a solution. The solution was sparged with $N_2$ overnight and then UV light exposed for 4 sec (1 J/$cm^2$, 395 nm) at room temperature. The solution turned to a solid within 5 minutes after UV radiation and released significant heat, indicating the monomer was polymerized. The UV-DSC (1 J/$cm^2$, 400 nm, 30° C.) studies showed that the composition exhibited an exothermic peak after UV exposure for 4 secs. The polymerized solid was then immersed in THF and found to be insoluble, evidencing that the obtained solid is a crosslinked polymer, demonstrating that the solid polymer was formed by both the ROMP of norbornene functional groups as well as the cationic polymerization of the epoxide groups as described herein.

Example 2

Mass Polymerization of HexylTD/CHEpNB with Bluesil PI 2074 and Ru1

In a glass bottle, Ru1 (1 molar part), Bluesil PI 2074 (2 molar parts) and ITX (1 molar part) were dissolved in mixed monomers of HexylTD/CHEpNB (50/50 mole ratio, 10,000 molar parts) to form a solution. The solution was purged by $N_2$ and then UV light exposed for 4 sec (4 J/$cm^2$, 395 nm) at room temperature. The solution turned to a solid within 5 minutes after UV radiation and released significant heat, indicating the monomer was polymerized. The UV-DSC (4 J/$cm^2$, 400 nm, 30° C.) studies showed that the composition exhibited an exothermic peak after UV exposure for 4 secs. The polymerized solid was then immersed in THF and found to be insoluble. It is again evident that the obtained solid is a crosslinked polymer, i.e., formed from both the cationic polymerization of epoxide and the ROMP of norbornene functional groups.

Example 3

Mass Polymerization of PENB/CHEpNB with Bluesil PI 2074 and Ru1

In a glass bottle, Ru1 (1 molar part), Bluesil PI 2074 (2 molar parts) and ITX (1 molar part) were dissolved in mixed monomers of PENB/CHEpNB (90/10, 5,000 molar parts) to form a solution. The solution was sparged with $N_2$ for overnight and then UV light exposed for 4 sec (2 J/$cm^2$, 395 nm) at room temperature. The solution turned to a solid after 5 minutes after UV radiation and released significant heat, indicating the monomer was polymerized. The UV-DSC (2 J/$cm^2$, 400 nm, 30° C.) studies showed that the composition exhibited an exothermic peak after UV exposure for 4 secs. The polymerized solid was then immersed in THF and found to be insoluble. It is evident that the obtained polymeric solid is a crosslinked polymer, which indicates again both reaction mechanisms are operating in this Example 3, i.e. cationic polymerization of epoxide and ROMP of norbornene functional groups.

Comparative Example 1

Mass Polymerization of CHEpNB with Bluesil PI 2074 Only

In a glass bottle, Bluesil PI 2074 (2 molar parts) and ITX (1 molar part) were dissolved in CHEpNB (5,000 molar parts) under sonication to form a solution. The solution was then sparged with $N_2$ and then UV light exposed for 4 sec (1 J/$cm^2$, 395 nm) at room temperature. The solution turned into a solid in 5 minutes and released significant heat, indicating the monomer was polymerized. The UV-DSC (1 J/$cm^2$, 400 nm, 30° C.) studies showed that the composition exhibited an exothermic peak after UV exposure for 4 secs. The polymerized solid was then immersed in THF and found to be soluble indicating that the polymer is not a thermoset. This demonstrates that in the absence of ruthenium catalysts the composition undergoes only the cationic ring opening polymerization of the epoxy groups which is not crosslinked and thus soluble.

Comparative Example 2

Mass Polymerization of HexTD/CHEpNB with Bluesil PI 2074 Only

In a glass bottle, Bluesil PI 2074 (2 molar parts) and ITX (1 molar part) were dissolved in mixed monomers of HexylTD/CHEpNB (50/50 molar ratio, 10,000 molar parts) to form a solution. The solution was then sparged with $N_2$ and then UV light exposed for 4 sec (4 J/$cm^2$, 395 nm) at room temperature. The solution turned to viscous liquid after 5 minutes after UV exposure, and it remained as viscous liquid after 1 h, indicating only the epoxy functional groups were polymerized and the NB functional groups were not polymerized. The obtained viscous liquid was then immersed in THF and found to be soluble indicating that the viscous liquid is not crosslinked. It is evident that the obtained viscous liquid is not a crosslinked polymer, which indicates again that only the cationic polymerization of the epoxide groups takes place under these conditions.

Comparative Example 3

Mass Polymerization of PENB with Bluesil PI 2074 and Ru-1 (AS2107)

In a glass bottle, Ru-1 (1 molar part), Bluesil PI 2074 (2 molar parts), ITX (1 molar parts) were dissolved in PENB (5,000 molar parts) under sonication to form a clear solution. This solution was purged by $N_2$ and then UV light exposed for 4 sec (2 J/$cm^2$, 395 nm) at room temperature. The solution turned to a hard solid after 5 minutes, indicating the monomer was polymerized. The UV-DSC (2 J/$cm^2$, 400 nm, 30° C.) studies showed that the composition exhibited an exothermic peak after UV exposure for 4 secs. The obtained solid was then immersed in THF and found to be soluble indicating that the solid is not crosslinked. It is evident that this polymer is not crosslinked because of the fact that ROMP of norbornene functional groups is taking place and as there are no epoxy groups present in the PENB olefinic monomer there is no cationic polymerization taking place.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A thermoset film forming composition selected from the group consisting of:

2-(4-(bicyclo [2.2.1]hept-5-en-2-yl) butyl) oxirane (EHNB), (1-(2,6-diethylphenyl)-3,3,5,5-tetramethylpyrrolidin-2-yl) (tris-isopropylphosphine)ruthenium carbide dichloride (Ru1), tolylcumyliodonium-tetrakis pentafluorophenylborate and 2-isopropyl-9H-thioxanthen-9-one (ITX);

3-(bicyclo [2.2.1]hept-5-en-2-yl)-7-oxabicyclo [4.1.0] heptane (CHEPNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX); and 2-hexyl-1,2,3,4,4a,5,8,8a-octahydro-1,4:5,8-dimethanonaphthalene (HexylTD), 3-(bicyclo [2.2.1]hept-5-en-2-yl)-7-oxabicyclo [4.1.0]heptane (CHEPNB), (1-(2,6-diethylphenyl)-3,3,5,5-tetramethylpyrrolidin-2-yl) (tris- isopropylphosphine) ruthenium carbide dichloride (Ru1), tolylcumyliodonium-tetrakis pentafluorophenylborate and 2-isopropyl-9H-thioxanthen-9-one (ITX).

2. The composition according to claim 1, wherein said composition is in a clear liquid state having a viscosity below 100 centipoise at room temperature.

3. The composition according to claim 1, wherein said composition is in a clear liquid state having a viscosity from 5 to 100 centipoise at room temperature.

4. The composition according to claim 1, wherein said composition is in a clear liquid state having a viscosity lower than 20 centipoise at room temperature.

5. The composition according to claim 1, wherein said composition forms a substantially transparent thermoset film when exposed to suitable actinic radiation in the wavelength of 200 nm to 400 nm, and wherein said film has a transmission of equal to or higher than 90 percent of visible light.

6. The composition according to claim 1, which is selected from the group consisting of:

3-(bicyclo [2.2.1]hept-5-en-2-yl)-7-oxabicyclo [4.1.0] heptane (CHEpNB), (1-(2,6-diethylphenyl)-3,3,5,5-tetramethylpyrrolidin-2-yl) (tris-isopropylphosphine)ruthenium carbide dichloride (Ru1), tolylcumyliodonium-tetrakis pentafluorophenylborate and 2-isopropyl-9H-thioxanthen-9-one (ITX); and 2-hexyl-1,2,3,4,4a,5,8,8a-octahydro-1,4:5,8-dimethanonaphthalene (HexylTD), 3-(bicyclo [2.2.1]hept-5-en-2-yl)-7-oxabicyclo [4.1.0]heptane (CHEPNB), (1-(2,6-diethylphenyl)-3,3,5,5-tetramethylpyrrolidin-2-yl) (tris- isopropylphosphine)ruthenium carbide dichloride (Ru1), tolylcumyliodonium-tetrakis pentafluorophenylborate and 2-isopropyl-9H-thioxanthen-9-one (ITX).

7. The composition according to claim 1, which is:

2-(4-(bicyclo [2.2.1] hept-5-en-2-yl) butyl) oxirane (EHNB), (1-(2,6- diethylphenyl)-3,3,5,5-tetramethylpyrrolidin-2-yl)(tris-isopropylphosphine)ruthenium carbide dichloride (Ru1), tolylcumyliodonium-tetrakis pentafluorophenylborate and 2-isopropyl-9H-thioxanthen-9-one (ITX).

8. The composition according to claim 1, which is:

3-(bicyclo [2.2.1]hept-5-en-2-yl)-7-oxabicyclo[4.1.0] heptane (CHEPNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX).

9. The composition according to claim 1, which is:

2-hexyl-1,2,3,4,4a,5,8,8a-octahydro-1,4:5, 8-dimethanonaphthalene (HexylTD), 3-(bicyclo [2.2.1]hept-5-en-2-yl)-7-oxabicyclo [4.1.0]heptane (CHEPNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX).

10. A thermoset film comprising the composition of claim 1.

11. An optoelectronic device comprising the composition of claim 1.

12. A kit for forming a thermoset film, wherein it is dispensed a composition selected from the group consisting of:

2-(4-(bicyclo [2.2.1] hept-5-en-2-yl)butyl)oxirane (EHNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX);

3-(bicyclo [2.2.1]hept-5-en-2-yl)-7-oxabicyclo [4.1.0] heptane (CHEpNB), (1-(2,6-diethylphenyl)-3,3,5,5-tetramethylpyrrolidin-2-yl)(tris-isopropylphosphine)ruthenium carbide dichloride (Ru1), tolylcumyliodonium-tetrakis pentafluorophenylborate and 2-isopropyl-9H-thioxanthen-9-one (ITX);

2-hexyl-1,2,3,4,4a,5,8,8a-octahydro-1,4:5,8-dimethanonaphthalene (HexylTD), 3-(bicyclo [2.2.1]hept-5-en-2-yl)-7-oxabicyclo [4.1.0]heptane (CHEPNB), (1-(2,6-diethylphenyl)-3,3,5,5- tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX).

13. The kit according to claim 12, wherein when the composition of said kit is exposed to suitable actinic radiation in the wavelength of 200 nm to 400 nm it forms a substantially transparent thermoset film having at least 90 percent of visible light transmission.

14. The kit according to claim 12, which is selected from the group consisting of:

3-(bicyclo [2.2.1]hept-5-en-2-yl)-7-oxabicyclo [4.1.0] heptane (CHEPNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX); and 2-hexyl-1,2,3,4,4a,5,8,8a-octahydro-1,4:5,8-dimethanonaphthalene (HexylTD), 3-(bicyclo [2.2.1]hept-5-en-2-yl)-7-oxabicyclo [4.1.0]heptane (CHEpNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX).

15. The kit according to claim 12, wherein the composition is:

2-(4-(bicyclo [2.2.1]hept-5-en-2-yl) butyl) oxirane (EHNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX).

16. The kit according to claim 12, wherein the composition is:

3-(bicyclo [2.2.1]hept-5-en-2-yl)-7-oxabicyclo [4.1.0] heptane (CHEPNB), (1-(2,6-diethylphenyl)-3,3,5,5-tetramethylpyrrolidin-2-yl) (tris- isopropylphosphine) ruthenium carbide dichloride (Ru1), tolylcumyliodonium-tetrakis pentafluorophenylborate and 2-isopropyl-9H-thioxanthen-9-one (ITX).

17. The kit according to claim 12, wherein the composition is:

2-hexyl-1,2,3,4,4a,5,8,8a-octahydro-1,4:5,8-dimethanonaphthalene (HexylTD), 3-(bicyclo [2.2.1]hept-5-en-2-yl)-7-oxabicyclo [4.1.0]heptane (CHEPNB), (1-(2,6-diethylphenyl)-3,3,5,5-tetramethylpyrrolidin-2-yl) (tris-isopropylphosphine) ruthenium carbide dichloride (Ru1), tolylcumyliodonium-tetrakis pentafluorophenylborate and 2-isopropyl-9H-thioxanthen-9-one (ITX).

* * * * *